(12) United States Patent
Kitamura

(10) Patent No.: US 6,900,081 B2
(45) Date of Patent: May 31, 2005

(54) METHOD OF MANUFACTURING SEMICONDUCTOR INTEGRATED CIRCUIT DEVICE

(75) Inventor: Akio Kitamura, Nagano (JP)

(73) Assignee: Fuji Electronic Co., Ltd. (JP)

( * ) Notice: Subject to any disclaimer, the term of this patent is extended or adjusted under 35 U.S.C. 154(b) by 0 days.

(21) Appl. No.: 10/643,718

(22) Filed: Aug. 19, 2003

(65) Prior Publication Data

US 2004/0051137 A1 Mar. 18, 2004

Related U.S. Application Data

(62) Division of application No. 10/085,632, filed on Feb. 27, 2002, now Pat. No. 6,639,287.

(30) Foreign Application Priority Data

Feb. 27, 2001 (JP) ........................................ 2001-052099

(51) Int. Cl.[7] ...................... H01L 21/82; H01L 21/8238; H01L 21/8234
(52) U.S. Cl. ........................ 438/129; 438/228; 438/275
(58) Field of Search ................................ 438/129, 228, 438/275

(56) References Cited

U.S. PATENT DOCUMENTS

| 4,939,386 | A | | 7/1990 | Shibata et al. ............... 307/304 |
| 4,972,371 | A | | 11/1990 | Komori et al. .............. 365/185 |
| 5,468,983 | A | | 11/1995 | Hirase et al. ................ 257/344 |
| 5,885,874 | A | * | 3/1999 | Gardner ........................ 438/289 |
| 6,469,347 | B1 | | 10/2002 | Oda et al. .................... 257/345 |
| 6,653,694 | B1 | * | 11/2003 | Osanai ........................ 257/392 |

* cited by examiner

Primary Examiner—Howard Weiss
(74) Attorney, Agent, or Firm—Rossi, Kimms & McDowell

(57) ABSTRACT

A semiconductor device has a depletion type MIS transistor, a transistor forming a masked ROM, and a submicron CMOS integrated on a single or common semiconductor substrate, while minimizing the steps of manufacturing the depletion type MIS transistor. During implantation of ions for changing an enhancement type transistor into a depletion type transistor, impurity ions can be implanted to change the transistor forming the masked ROM into resistance, so that the depletion type transistor, the transistor constituting the mark ROM, and a submicron CMOS can be integrated on a single or common semiconductor substrate.

10 Claims, 27 Drawing Sheets

US 6,900,081 B2

METHOD OF MANUFACTURING SEMICONDUCTOR INTEGRATED CIRCUIT DEVICE

This application is a divisional of U.S. application Ser. No. 10/085,632, filed Feb. 27, 2002, now U.S. Pat. No. 6,639,287.

BACKGROUND

Conventionally, depletion type MOS transistors have been used to form reference voltage circuits with high output voltage accuracy. The depletion type MOS transistor is a device that is formed by implanting impurity ions into an enhancement type MOS transistor so that current can flow even when a gate-source voltage is zero. A masked ROM is a device that is formed by changing part of MOS transistors arranged in the form of a matrix into resistance. Conventionally, in a power management-associated apparatus, such as a portable equipment, a digital circuit having a masked ROM and a reference voltage generating circuit supplying power to the digital circuit are installed in different IC chips.

In such a power management-associated apparatus, such as a portable equipment, however, it is desirable to provide such a digital circuit comprised of a depletion type MOS transistor in a single IC chip. It is also desirable to minimize the steps of manufacturing the depletion type MOS transistor to reduce number of parts and cost, while simplifying the manufacturing process.

Accordingly, there is a need for a semiconductor integrated circuit device that integrates the depletion MIS transistor, the transistor forming a masked ROM, and a submicron CMOS on a single semiconductor substrate, while minimizing the steps of manufacturing the same. The present invention addresses this need.

SUMMARY OF THE INVENTION

The present invention relates to a semiconductor integrated circuit device and a method of manufacturing the same, and more particularly to a semiconductor integrated circuit device that is equipped with a depletion type MIS transistor and a transistor forming a masked ROM. Further a submicron CMOS can be integrated with these transistors in a single or common semiconductor substrate.

One aspect of the present invention is a semiconductor integrated circuit device. This device can include a semiconductor substrate having a principal side, well region of at least a first-conductivity type, a first transistor of MIS depletion type, and a second transistor forming part of a masked ROM.

The first transistor can have a first source region and a first drain region of a second-conductivity-type formed in the well region. A first channel region can be interposed between the first source and drain regions and a gate insulating film can be formed over the first channel region, and a first gate electrode can be formed on the first channel region over the gate insulating film. The first channel region has an impurity concentration that permits current to flow when a gate-source voltage is zero.

The second transistor can have a second channel region having the same impurity concentration as the first channel region formed in the well region. A second source region and a drain region of a second-conductivity-type respectively can be formed at both sides of the second channel region, and a second gate electrode can be formed on the second channel region over the gate insulating film.

The semiconductor integrated circuit device can further include a first LDD region of a second-conductivity-type having a lower impurity concentration than the first source region or the first drain region, formed between the first channel region and the first source region and between the first channel and the first drain region. It can further include a second LDD region of a second-conductivity-type having a lower impurity concentration than the second source region or the second drain region, formed between the second channel region and the second source region and between the second channel and the second drain region.

The semiconductor integrated circuit device can further include a punch-through stopper region of a first-conductivity-type formed between the first source region and the first drain region and between the second source region and the second drain region.

The semiconductor integrated circuit device can further include an enhancement type NMOS transistor and an enhancement type PMOS transistor. The NMOS transistor can be formed over the well region, which has a P type well region formed over the principal side of the semiconductor substrate, and can include a third source region of an N type and a third drain region an N type formed in the P type well region, and a third channel region interposed between the third source and drain regions, a third LDD region of an N type having a lower impurity concentration than the third source region or the third drain region formed between the third channel region and the third source region and between the third channel region and the third drain region, a third gate electrode formed on the third channel region over the gate insulating film, and a P type punch-through stopper region formed between the third source region and the third drain region.

The PMOS transistor can be formed over the well region, which has an N type well region is formed at the principal side of the semiconductor substrate, and can include a fourth source region of a P type and a fourth drain region of a P type formed in the N type well region, a fourth channel region interposed between the fourth source and drain regions, and a fourth LDD region of a P type having a lower impurity concentration than the fourth source region or the fourth drain region formed between the fourth channel region and the fourth source region and between the fourth channel region and the fourth drain region, a fourth gate electrode formed on the fourth channel region over the gate insulating film, and an N type punch-through stopper region formed between the fourth source region and the fourth drain region.

The semiconductor integrated circuit device can further include a first-conductivity-type punch-through stopper region provided between the first source region and the first drain region. The first conductivity-type punch-through stopper region also can be provided between the second source region and the second drain region.

Another aspect of the present invention is a method of manufacturing a semiconductor integrated circuit device. The method can comprise the steps of: forming the first transistor of a MIS depletion type and the second transistor forming part of a masked ROM on a single semiconductor substrate by: forming a well region of a first-conductivity-type in a first region where the first transistor is to be formed and a second region where the second transistor is to be formed, selectively oxidizing the regions where the first and second transistors are to be formed, implanting impurity ions of a first-conductivity-type in the regions where the first and second transistors are to be formed, implanting impurity ions of a second-conductivity-type in the regions where the first and second transistors are to be formed to permit current to flow when a gate-source voltage of the first transistor is zero, and forming the gate insulating film, gate electrode, and source and drain regions of a second-conductivity-type in each of the first and second transistors.

BRIEF DESCRIPTION OF THE DRAWINGS

These and other features, aspects, and advantages of the present invention will become more apparent from the following description, appended claims, and accompanying exemplary embodiments shown in the drawings, which are briefly described below.

DETAILED DESCRIPTION

Preferred embodiments of the present invention will now be described in detail with reference to the drawings. In the following description, a P type is regarded as the first conductivity type while an N type is regarded as the second conductivity type, though their conductivity types may be reversed.

According to one aspect of the present invention, the semiconductor integrated circuit device can be formed by implanting impurity ions to change the transistor forming the masked ROM into resistance while implanting ions for changing the enhancement type transistor into the depletion type transistor, so that at least a depletion type MIS transistor and a transistor forming a masked ROM can be integrated into a single semiconductor substrate. Further, a submicron CMOS can be integrated with the depletion type MIS transistor and the transistor forming the masked ROM can be integrated into a single semiconductor substrate. The implantation of impurity ions for changing the enhancement type transistor into the depletion type transistor and the implantation of impurity ions for changing the transistor constituting the masked ROM into the resistance can be carried out by the same ion implantation process.

Figure 1:
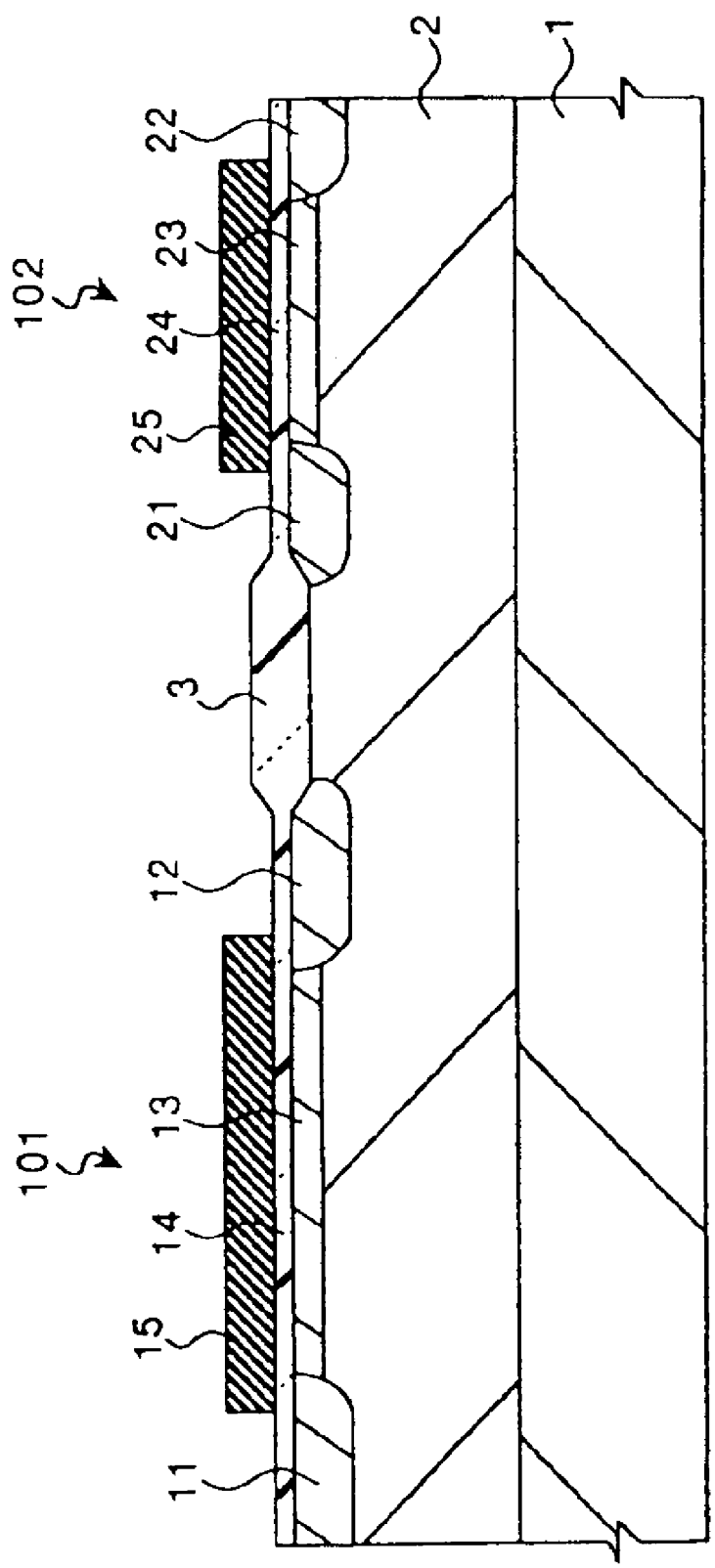
FIG. 1 is a longitudinal sectional view showing a principal part of a semiconductor integrated circuit device according to a first embodiment of the present invention.

FIG. 1 is a longitudinal sectional view showing a principal part of a semiconductor integrated circuit device according to a first embodiment of the present invention. In this semiconductor integrated circuit device, an NMOS transistor 101 (hereinafter referred to as "depletion MOS transistor") can serve as a depletion type MIS transistor for a reference voltage generating circuit, for example, and an NMOS transistor (hereinafter referred to as "masked ROM transistor") forming a masked ROM can be formed on a single or common semiconductor substrate 1.

A P type well region 2 is formed on the principal side of the P type semiconductor substrate 1. A field oxide film 3 for separating elements can be formed on the entire surface of the well region 2. The field oxide film 3 separates the depletion MOS transistor 101 and the masked ROM transistor 102 from each other.

The depletion MOS transistor 101 can be comprised of an $N^+$ source region 11, an $N^+$ drain region 12, a channel region 13 interposed between the $N^+$ source and drain regions 11 and 12, and a gate insulating film 14 and a gate electrode 15 formed on the channel region 13. The channel region 13 is formed by implanting ions to form a $P^-$ channel region and by implanting ions to change the $P^-$ channel region into an $N^-$ depletion region.

The implantation of ions for forming the $P^-$ channel region is carried out in order to regulate a threshold voltage of another transistor (not illustrated) that is integrated together with the depletion MOS transistor 102 on the semiconductor substrate 1. The N-depletion region can be formed by depositing ions with a dose amount of $1\times10^{12}$ to $5\times10^{12}/cm^2$. Although not restricted particularly, the ion dose amount for forming the $P^-$ channel region is about $1.2\times10^{12}/cm^2$, and the ion dose amount for forming the N-depletion region is about $3\times10^{12}/cm^2$. In this case, the total ion dose amount for forming the channel region 13 is about $1.8\times10^{12}/cm^2$. In the case where the depletion MOS transistor 101 is used for a reference voltage generating circuit, an output voltage can vary within the range of ±0.5%.

The masked ROM transistor 102 can be comprised of an $N^+$ source region 21, $N^+$ drain region 22, a channel region 23 interposed between the $N^+$ source region 21 and the $N^+$ drain region 22, and a gate insulating film 24 and a gate electrode 25 formed on the channel region 23. The channel region 23 is formed by changing a $P^+$ channel region formed in the channel region 23 into resistance by implantation of ions at the same time as implantation of ions for regulating a threshold voltage of another transistor (not illustrated).

The dose amount of ions for changing the $P^-$ channel region into resistance is $1\times10^{12}$ to $5\times10^{12}/cm^2$, and thus the implantation of ions for changing the $P^-$ channel region into resistance is carried out at the same time as the implantation of ions for changing the channel region 13 into the depletion MOS transistor 101 into the depletion region. The masked ROM transistor 102 has a channel length of about 1.6 μm, and a channel width of about 2 μm, for example. The ON resistance of the masked ROM transistor 102 can be about 100 kΩ.

Among the transistors constituting the masked ROM, only transistors corresponding to desired addresses of the masked ROM are changed into resistances as is the case with the above-mentioned masked ROM transistor 102. The impurity ions for changing transistors into resistances are not implanted into the other transistors constituting the masked ROM since they are shielded by a mask during that period. It should be noted that an interlayer insulating film, a source electrode, a drain electrode, wiring, a passivation film, and the like are omitted from FIG. 1 (this also applies to other drawings) for brevity.

Figure 2:
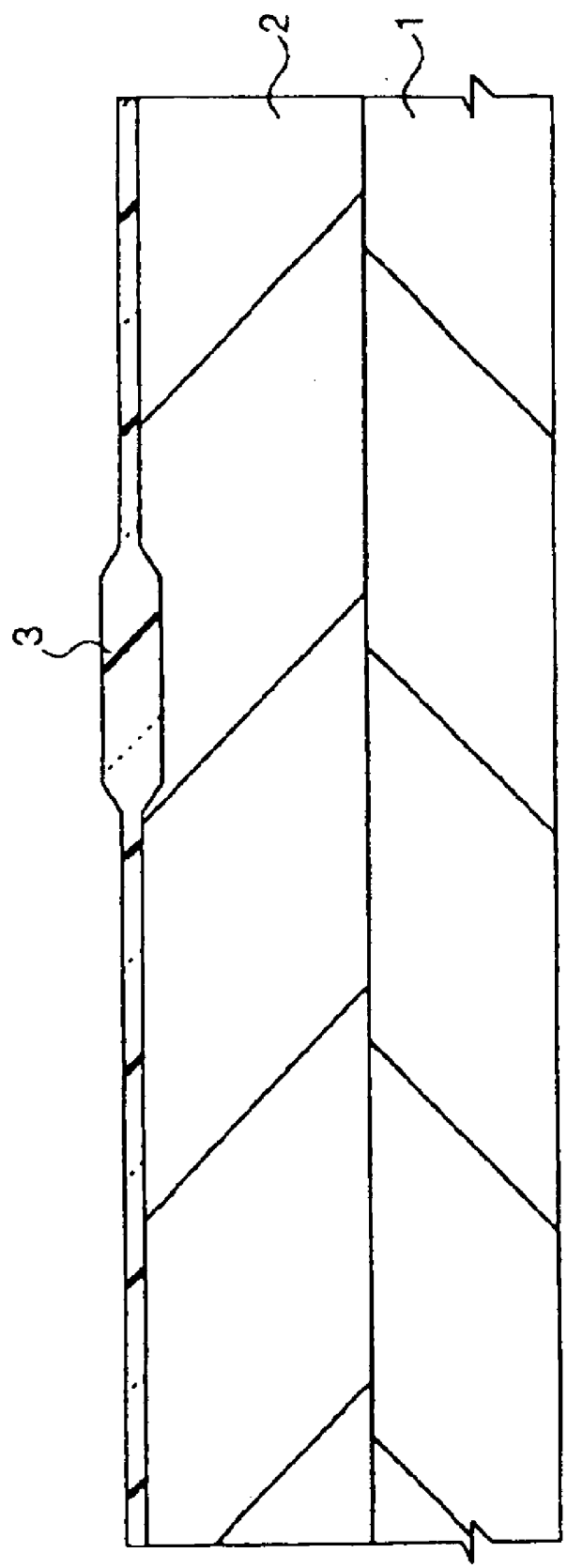
FIG. 2 is a longitudinal sectional view showing the principal part of the semiconductor integrated circuit device during manufacturing of the first embodiment of the present invention.

A description will now be given of a process for manufacturing the semiconductor integrated circuit device according to the first embodiment. FIGS. 1–4 are longitudinal sectional views showing the principal part of the semiconductor integrated circuit device during manufacturing of the first embodiment. First, as shown in FIG. 2, the well region 2 and the field oxide film 3 are formed at the principal side of the semiconductor substrate 1 by respective known methods.

$BF_2$ ions with a dose amount of about $1.2\times10^{12}/cm^2$ are implanted into the entire surface of the substrate by an ion implantation method to form a $P^-$ channel region. Thereafter, by using a mask, which has an opening in a region where the depletion MOS transistor 101 is to be formed and a region where the masked ROM transistor 102 is to be formed, P ions with a dose amount of about $3\times10^{12}/cm^2$ are implanted into the regions where the depletion MOS transistor and the masked ROM transistors 102 are to be formed. The mask shields a region where no P ion is to be implanted.

Figure 3:
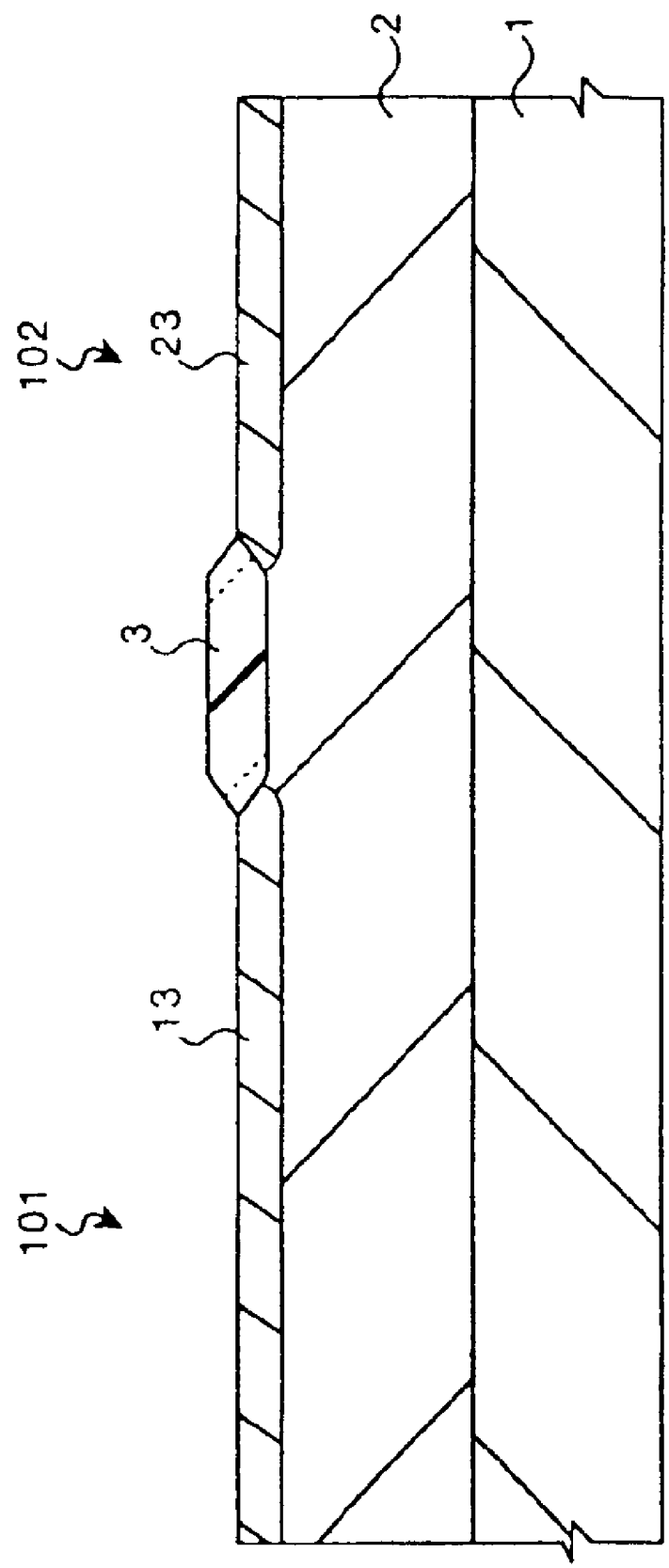
FIG. 3 is a longitudinal sectional view showing the principal part of the semiconductor integrated circuit device during manufacturing of the first embodiment of the present invention.

The implanted ions are activated by a thermal treatment to form the channel regions 13, 23. More specifically, the implantation of P ions following the implantation of $BF_2$ ions forms the channel region 13 in the depletion MOS transistor 101 and forms the channel region 23 in the masked ROM transistor 102. A thin oxide film is then removed from the regions where the respective elements are to be formed. FIG. 3 shows the state explained hereinabove.

Figure 4:
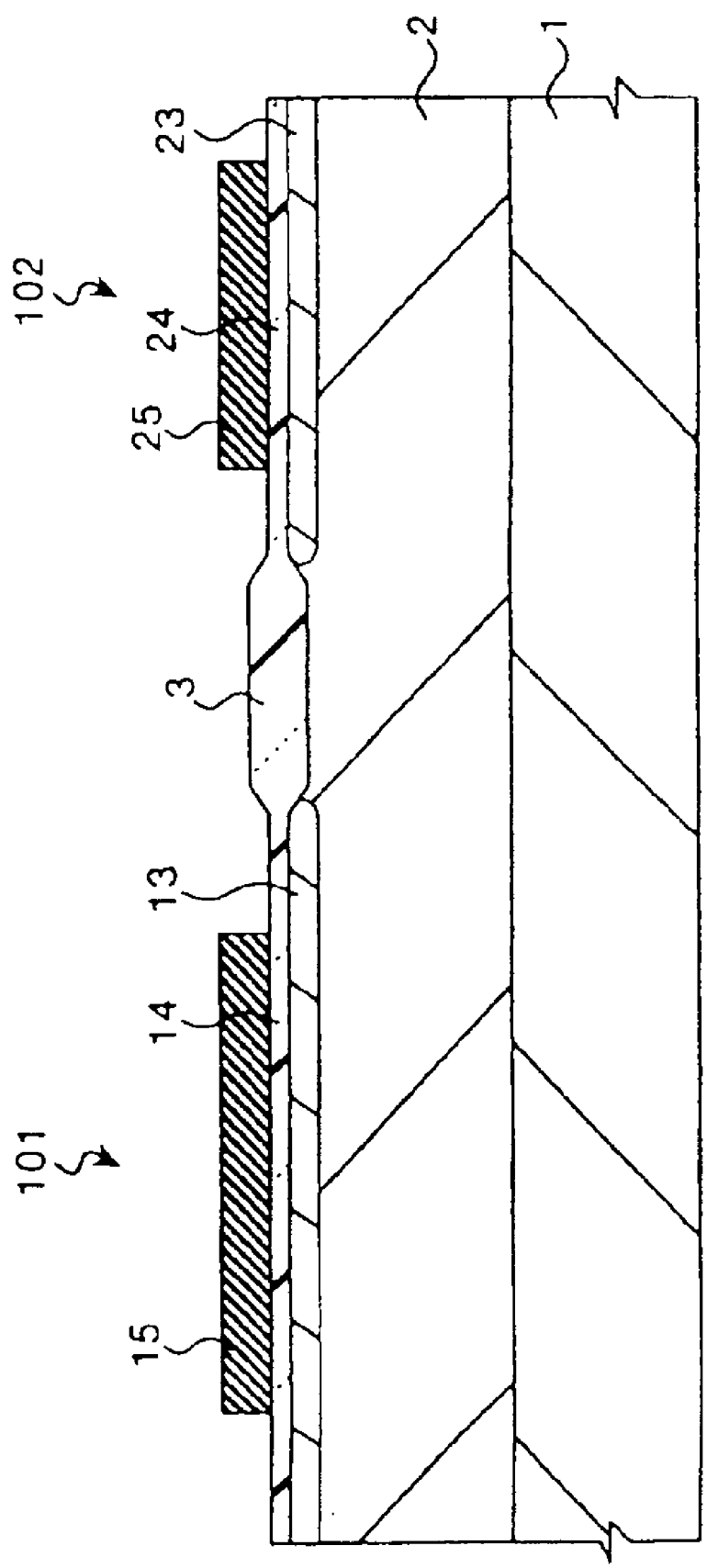
FIG. 4 is a longitudinal sectional view showing the principal part of the semiconductor integrated circuit device during manufacturing of the first embodiment of the present invention.

The gate insulating films 14, 24 and the gate electrodes 15, 25 are then formed by respective known methods as shown in FIG. 4. The $N^+$ source regions 11, 21 and the $N^+$ drain regions 12, 22 are then formed by self aligning using the gate electrodes 15, 25 as masks. This is illustrated in FIG. 1. It should be noted that each impurity-diffusing region are activated by a thermal treatment. Although not illustrated, an interlayer insulating film is laminated on the entire surface of the substrate and contact holes are formed in the surface of the substrate. The source electrode, the drain electrode, wiring and passivation film, and the like are then formed to complete the semiconductor integrated circuit device.

According to the above-described first embodiment, since the dose amount of P ions for forming the channel region 13 in the depletion MOS transistor 101 is equal to the dose amount of P ions for forming the channel region 23 in the masked ROM transistor 102, the P ions can be implanted in the respective regions by the same ion implantation step. This enables integration of the depletion MOS transistor 101 and the masked ROM transistor 102 on the same semiconductor substrate 1, while minimizing the steps of manufacturing the depletion MOS transistor 101.

Figure 5:
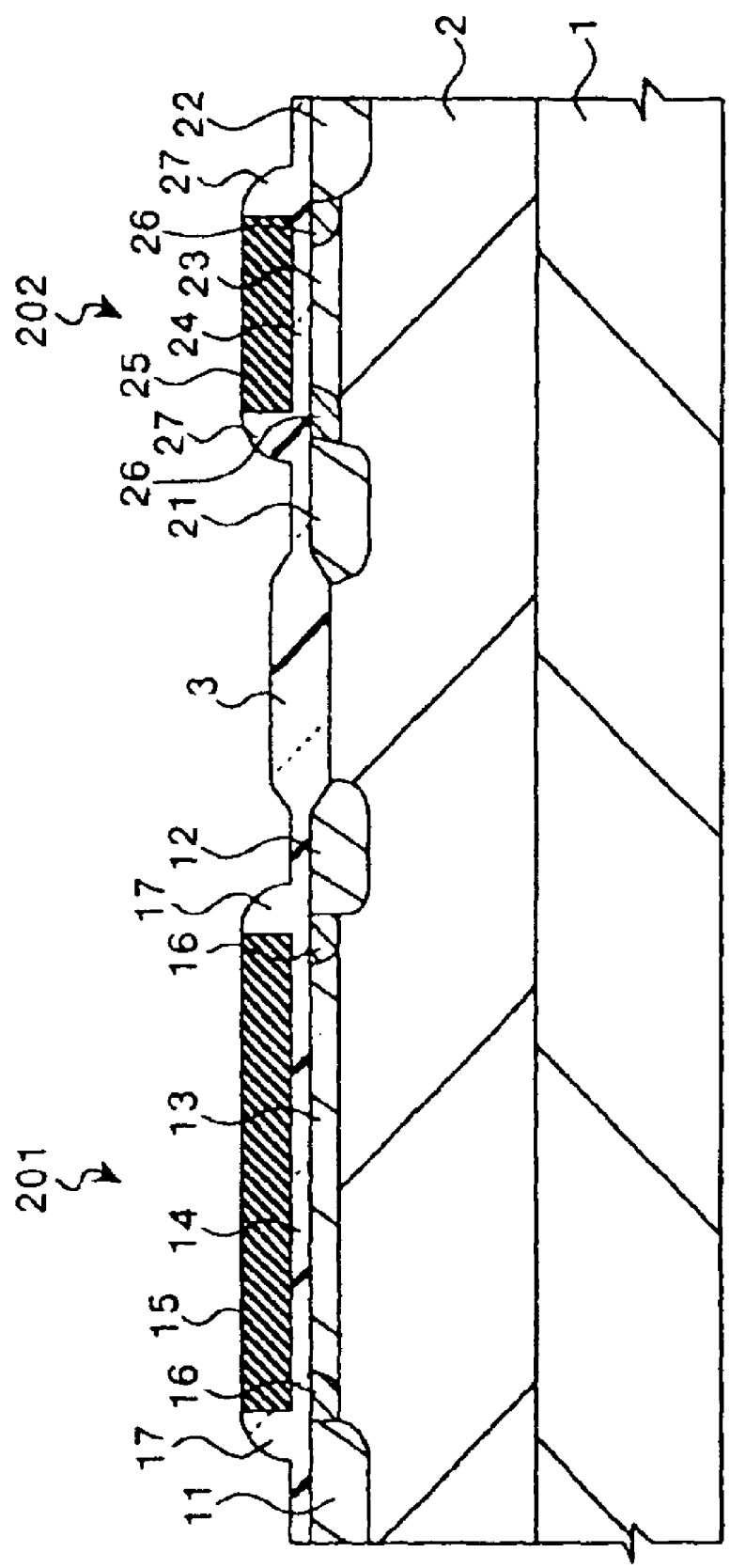
FIG. 5 is a longitudinal sectional view showing a principal part of a semiconductor integrated circuit device according to a second embodiment of the present invention.

FIG. 5 is a longitudinal sectional view showing a principal part of a semiconductor integrated circuit according to a second embodiment of the present invention. With the arrangement of the embodiment 1, the semiconductor integrated circuit device according to the second embodiment is constructed such that an N⁻ LDD region 16 having a lower impurity concentration than the N⁺ source regions 11, 12 is formed between the N⁺ source region 11 and the channel region 13 in a depletion MOS type transistor 201 and an N⁻ LDD region 26 having a lower impurity concentration than the N⁺ drain regions 12, 22 is formed between the N⁺ source region 21 and the N⁺ drain regions 22 and the channel region 23 in a masked ROM transistor 202. Further, spacer films 17, 27 are provided in the side portions of the gate electrodes 15, 25. Otherwise, the arrangement of the second embodiment 2 is identical to that of the first embodiment. Thus, parts and elements of the second embodiment corresponding to those of the first embodiment are denoted by the same reference numerals, and a description thereof is omitted herein.

According to the second embodiment, in the case where the depletion MOS transistor 201 is used for a reference voltage generating circuit, an output voltage can vary within the range of ±0.5%. The masked ROM transistor 202 has a channel length of about 1 μm and a channel width of about 2 μm, for example. The ON resistance of the masked ROM transistor 202 can be about 100 kΩ.

Figure 6:
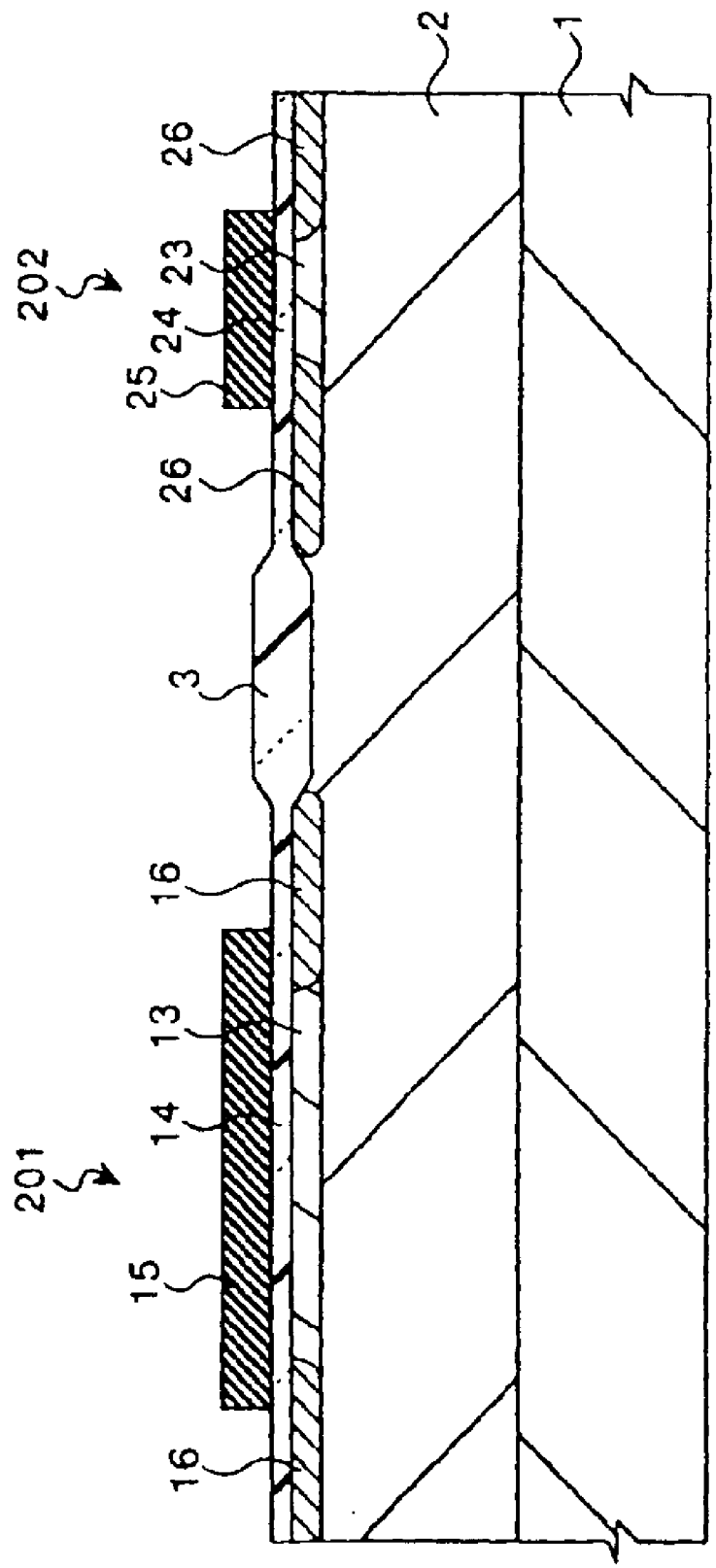
FIG. 6 is a longitudinal sectional view showing the principal part of the semiconductor integrated circuit device during manufacturing of the second embodiment of the present invention.

A description will now be given of a process for manufacturing the semiconductor integrated circuit device according to the second embodiment. FIG. 6 is a longitudinal sectional view showing the principal part of the semiconductor integrated circuit device during manufacturing of the second embodiment. First, as is the case with the first embodiment, the well region 2 and the field oxide film 3 are formed (referring to FIG. 2), and the channel regions 13, 23 are formed by implantation of $BF_2$ ions and P ions to remove a surface oxide film (referring to FIG. 3).

Then, as shown in FIG. 6, the gate insulating films 14, 24 and the gate electrodes 15, 25 are formed by respective known methods, and the N⁻ LDD regions 16, 26 are formed by self-aligning using the gate electrodes 15, 25 as masks. The spacer films 17, 27 are then formed, and the N⁺ source regions 11, 21 and the N⁺ drain regions 12, 22 are formed by self-aligning using the spacer films 17, 27 as masks. This is illustrated in FIG. 5. It should be noted that each impurity-diffusing region is activated by a thermal treatment. Although not illustrated, an interlayer insulating film can be laminated on the entire surface of the substrate, and contact holes are formed in the substrate. A source electrode, a drain electrode, wiring, a passivation film, and the like are then formed to complete the semiconductor integrated circuit device.

According to the above-described second embodiment, the P ions for forming the channel regions 13, 23 can be implanted in the respective regions by the same ion implantation process similarly to the embodiment 2, and this enables integration of the depletion MOS transistor 201 and the masked ROM transistor 202 on a single or common semiconductor substrate 1, while minimizing the steps of manufacturing the depletion MOS transistor 201.

Figure 7:
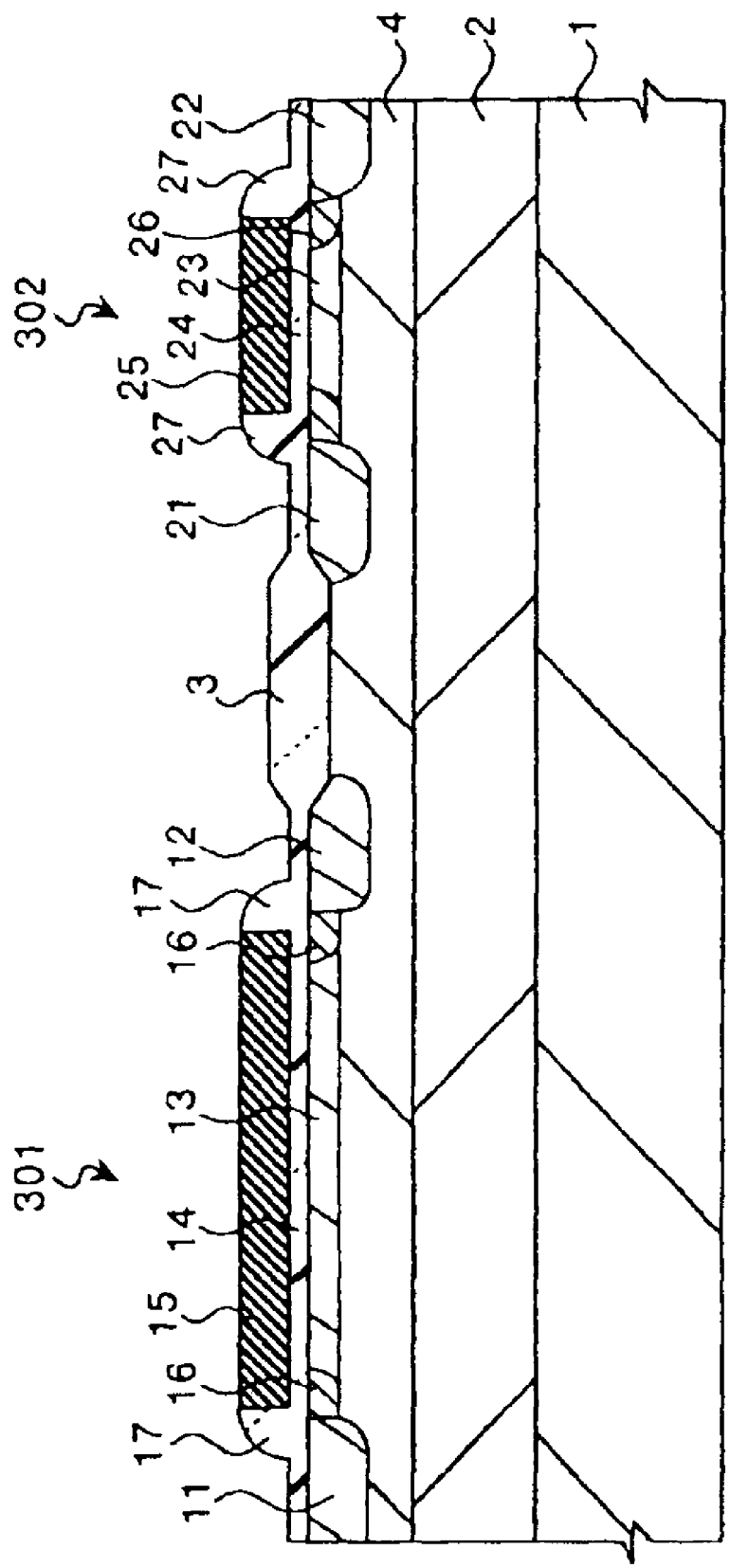
FIG. 7 is a longitudinal sectional view showing the principal part of a semiconductor integrated circuit device according to a third embodiment of the present invention.

FIG. 7 is a longitudinal sectional view showing a principal part of a semiconductor integrated circuit according to a third embodiment of the present invention. With the arrangement of the embodiment 2, the semiconductor integrated circuit device according to the embodiment 3 is comprised of a P⁻ punch-through stopper region 4 formed between the N⁺ source region 11 and the N⁺ drain region 12 in a depletion MOS transistor 301 and between the N⁺ source region 21 and the drain region 22 in a masked ROM transistor 302. Otherwise, the arrangement of the embodiment 3 is identical with that of the second embodiment. Thus, parts and elements of the embodiment 3 corresponding to those of the second embodiment are denoted by the same reference numerals, and a description thereof is omitted herein.

According to the third embodiment, in the case where the depletion MOS transistor 301 is used for a reference voltage generating circuit, an output voltage can vary within the range of ±0.5%. The masked ROM transistor 302 has a channel length of about 0.6 μm and a channel width of about 1 μm, for example. The ON resistance of the masked ROM transistor 302 can be about 100 kΩ.

Figure 8:
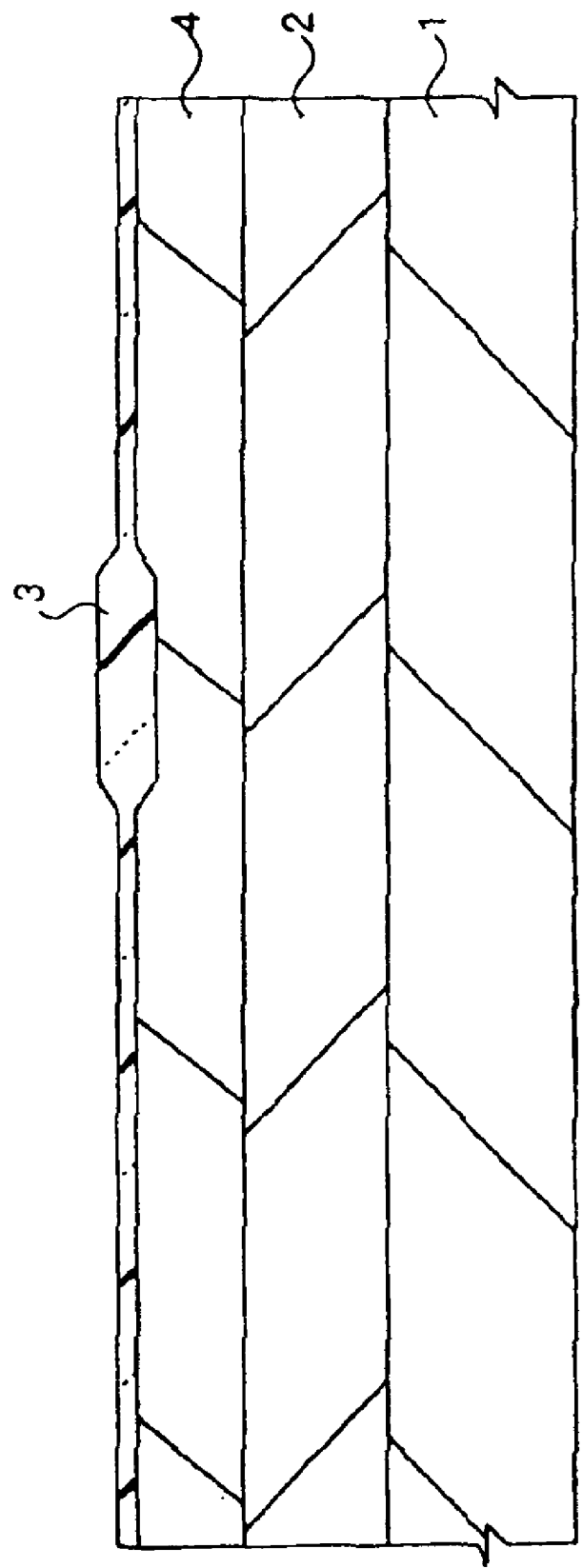
FIG. 8 is a longitudinal sectional view showing the principal part of the semiconductor integrated circuit device during manufacturing of the third embodiment of the present invention.
Figure 9:
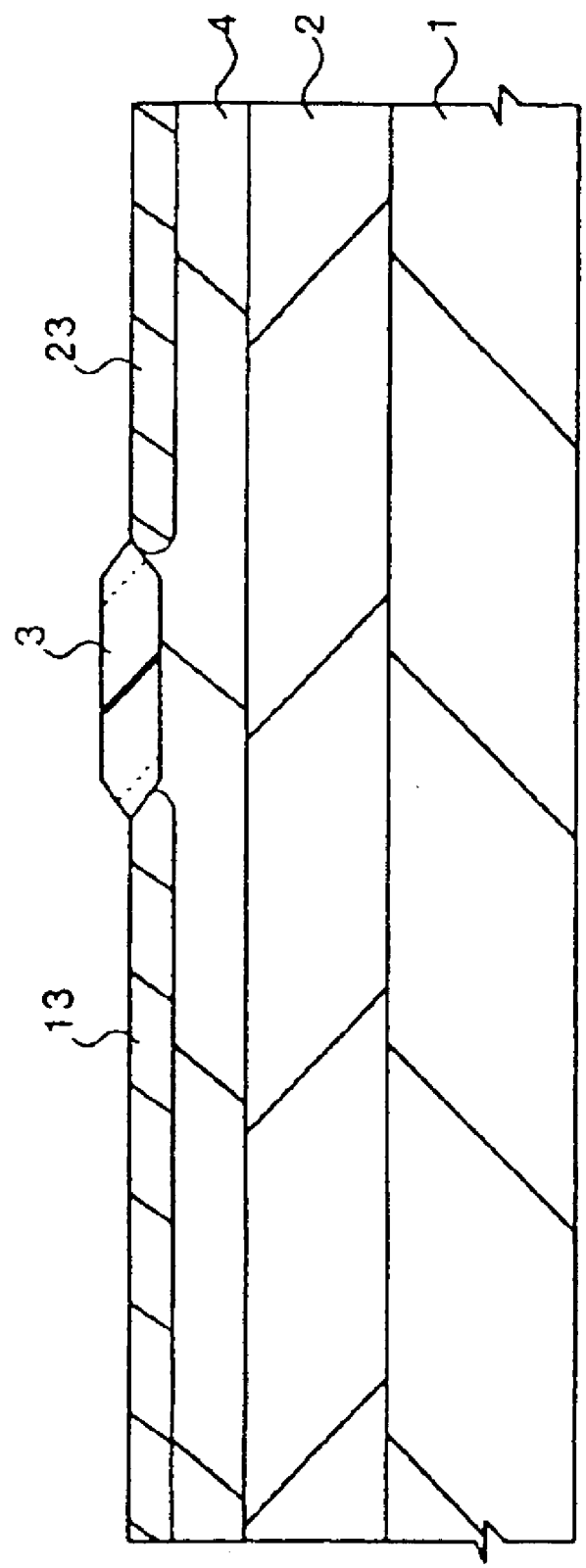
FIG. 9 is a longitudinal sectional view showing the principal part of the semiconductor integrated circuit device during manufacturing of the third embodiment of the present invention.
Figure 10:
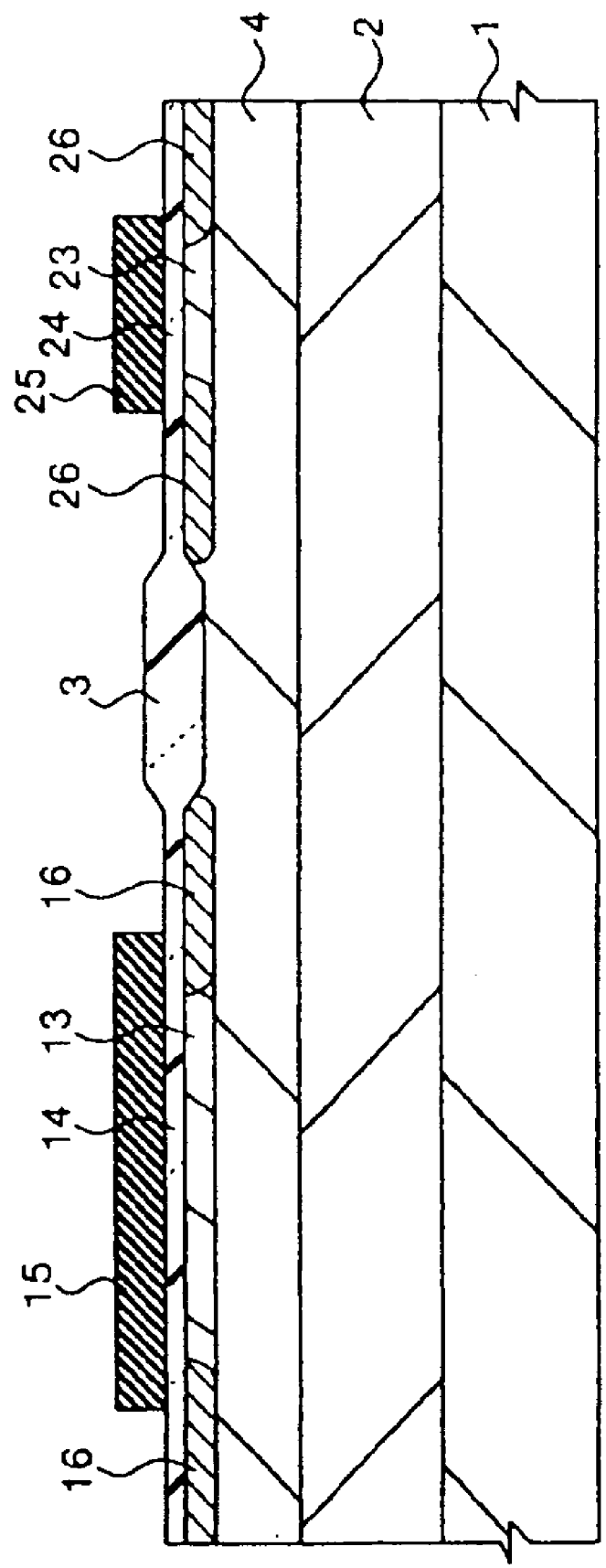
FIG. 10 is a longitudinal sectional view showing the principal part of the semiconductor integrated circuit device during manufacturing of the third embodiment of the present invention.

A description will now be given of a process for manufacturing the semiconductor integrated circuit device according to the third embodiment. FIGS. 8–10 are longitudinal sectional views showing the principal part of the semiconductor integrated circuit device during manufacturing of the third embodiment. First, as shown in FIG. 8, the well region 2 is formed at the principal side of the semiconductor substrate 1, the P⁻ punch-through stopper region 4 is then formed by a known method, and further, the field oxide film 3 is formed. As shown in FIG. 9, the channel regions 13, 23 are then formed by implantation of $BF_2$ ions and P ions to remove a surface oxide film.

Then, as shown in FIG. 10, the gate insulating films 14, 24, the gate electrodes 15, 25, and the N⁻ LDD regions 16, 26 are formed, the spacer films 17, 27 are then formed, and the N⁺ source regions 11, 21 and the N⁺ drain regions 12, 22 are formed. This is illustrated in FIG. 7. It should be noted that each impurity-diffusing region is activated by a thermal treatment. Although not illustrated, an interlayer insulating film can be laminated on the entire surface of the substrate, and contact holes are formed in the surface of the substrate. A source electrode, a drain electrode, wiring, a passivation film, and the like are then formed to complete the semiconductor integrated circuit device.

According to the above-described third embodiment, the P ions for forming the channel regions 13, 23 can be implanted in the respective regions by the same ion implantation process similarly to the first and second embodiments, and this enables integration of the depletion MOS transistor 301 and the masked ROM transistor 302 on a single or common semiconductor substrate 1, while minimizing the steps of manufacturing the depletion MOS transistor 301.

Figure 11:
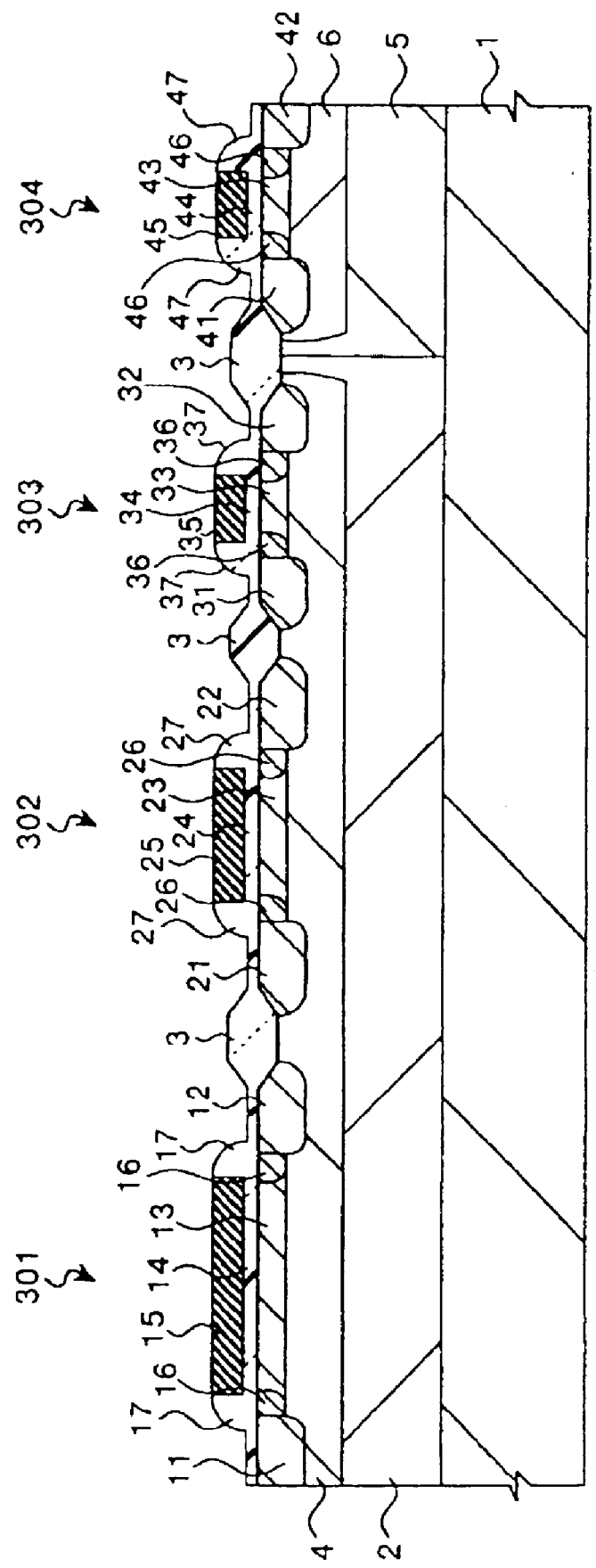
FIG. 11 is a longitudinal sectional view showing a principal part of a semiconductor integrated circuit device according to a fourth embodiment of the present invention.

FIG. 11 is a longitudinal sectional view showing a principal part of a semiconductor integrated circuit according to a fourth embodiment of the present invention. With the arrangement of the third embodiment, the semiconductor integrated circuit device according to the fourth embodiment is constructed such that an NMOS transistor 303 and an NMOS transistor 304 forming the submicron CMOS device, as well as the depletion MOS transistor 301 and the masked ROM transistor 302, can be integrated to a single or common semiconductor substrate.

The NMOS transistor 303 and the PMOS transistor 304 can be constructed with known methods. Therefore, the description thereof is omitted here. In FIG. 11, reference numerals 31, 32, 33, 34, 35, and 36 denote an N⁺ source region, an N⁺ drain region, a channel region, a gate insulating film, a gate electrode, an N⁻ LDD region, and a spacer film, respectively, in the NMOS transistor 303. In FIG. 11, reference numerals 41, 42, 43, 44, 45, 46 and 47 denote a P⁺ source region, a P⁺ drain region, a channel region, a gate insulating film, a gate electrode, a P⁻ LDD region, and a spacer film, respectively, in the PMOS transistor 304.

The NMOS transistor 303 is formed in the P type well region 2, and the P⁻ punch-through stopper 4 is provided between the N⁺ source region 31 and the N⁺ drain region 32 in the NMOS transistor 303. The PMOS transistor 304 is formed in an N type well region 5 provided at the principal side of the semiconductor substrate 1. An N⁻ punch-through stopper region 6 is provided between the P⁺ source region 41 and the N⁺ drain region 42 in the PMOS transistor 304. Otherwise, the arrangement of the embodiment 4 is identical with that of the third embodiment. Thus, parts and elements of the fourth embodiment corresponding to those of the third embodiment are denoted by the same reference numerals, and a description thereof is omitted herein.

According to the fourth embodiment, in the case where the depletion MOS transistor 301 is used for a reference voltage generating circuit, an output voltage can vary within the range of ±0.5%. The masked ROM transistor 302 has a channel length of about 0.6 μm and a channel width of about 1 μm, for example. The ON resistance of the masked ROM transistor 302 can be about 100 kΩ.

Figure 12:
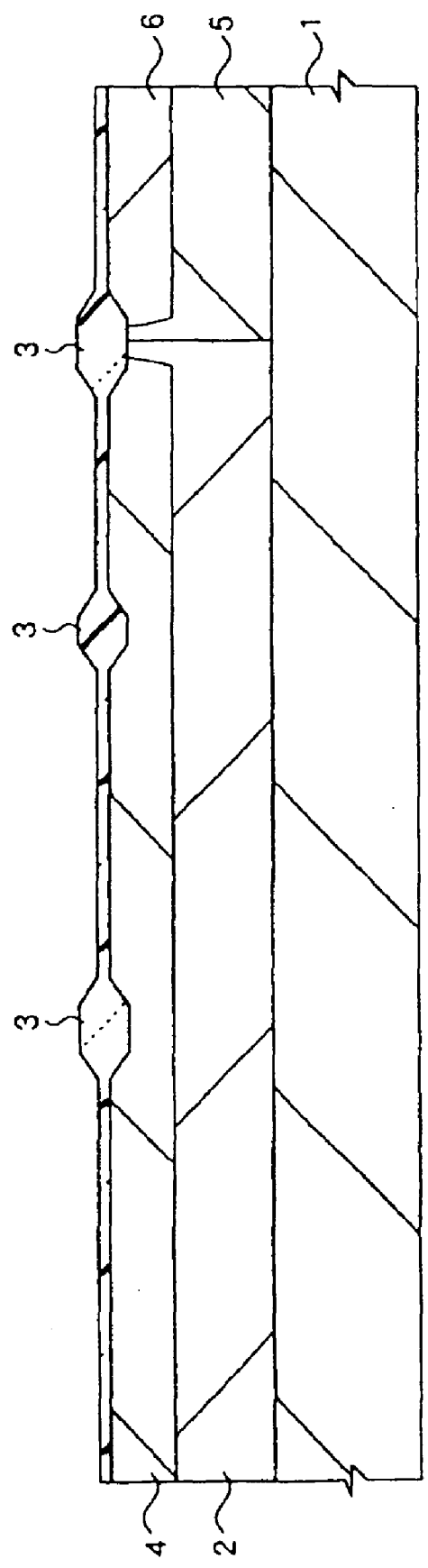
FIG. 12 is a longitudinal sectional view showing the principal part of the semiconductor integrated circuit device during manufacturing of the fourth embodiment of the present invention.
Figure 13:
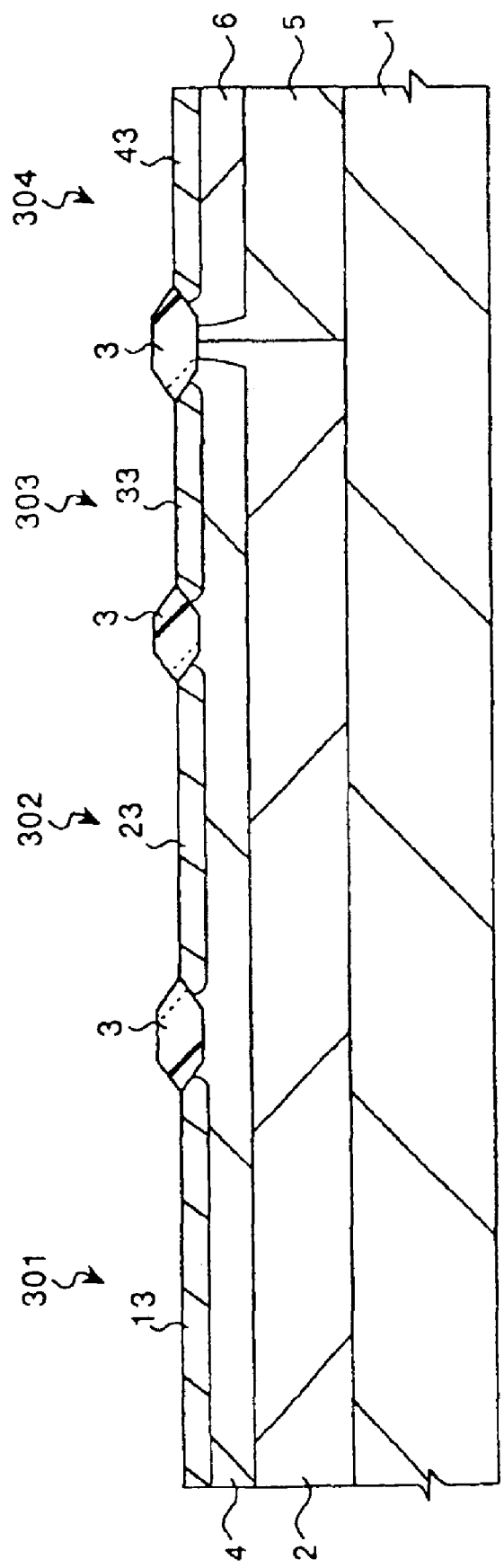
FIG. 13 is a longitudinal sectional view showing the principal part of the semiconductor integrated circuit device during manufacturing of the fourth embodiment of the present invention.
Figure 14:
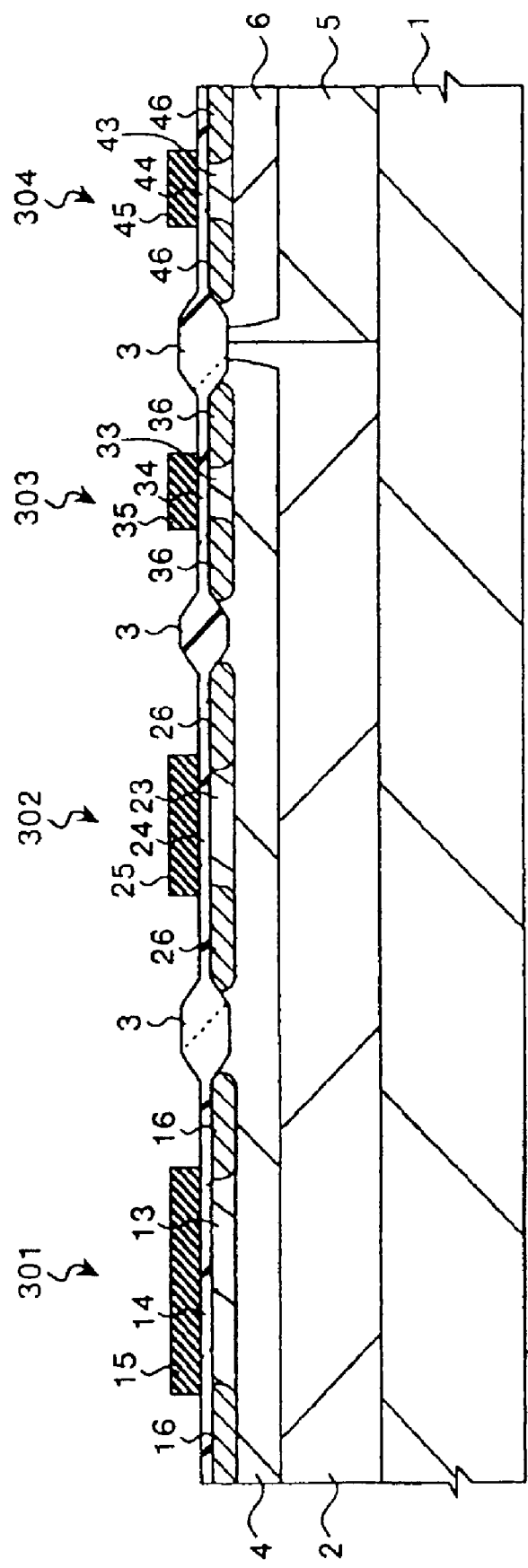
FIG. 14 is a longitudinal sectional view showing the principal part of the semiconductor integrated circuit device during manufacturing of the fourth embodiment of the present invention.

A description will now be given of a process for manufacturing the semiconductor integrated circuit device according to the fourth embodiment. FIGS. 12–14 are longitudinal sectional views showing the principal part of the semiconductor integrated circuit device during manufacturing of the fourth embodiment. First, as shown in FIG. 12, the N type well region 5 and the P type well region 2 are formed in this order at the principal side of the semiconductor substrate 1. Thereafter, the P⁻ punch-through stopper region 4 and the N punch-through stopper region 6 are formed by known methods, and the field oxide film 3 is then formed.

The channel regions 33, 43 are then formed by implantation of BF₂ ions as shown in FIG. 13. On this occasion, the BF₂ ions are also implanted into the channel regions 13, 23 in the depletion MOS transistor 301 and the masked ROM transistor 302, respectively. P ions are then implanted with a mask shielding the NMOS transistor 303, the PMOS transistor 304, and part of transistors forming a masked ROM to form the channel regions 13, 23. A surface oxide film is then removed.

Then, as shown in FIG. 14, the gate insulating films 14, 24, 34, 44 and the gate electrodes 15, 25, 35, 45 are formed, the N⁻ LDD regions 16, 26, 36, and the P⁻ LDD region 46 are formed in this order. The spacer films 17, 27, 37, 47 are then formed, the N⁺ source regions 11, 21 and the N⁺ drain regions 12, 22 are formed, and the P⁺ source region 41 and the P⁺ drain region 42 are formed. This is illustrated in FIG. 11. It should be noted that each impurity-diffusing region is activated by a thermal treatment. Although not illustrated, an interlayer insulating film can be laminated on the entire surface of the substrate, and contact holes are formed in the surface of the substrate. A source electrode, a drain electrode, wiring, a passivation film, and the like are then formed to complete the semiconductor integrated circuit device.

According to the above-described fourth embodiment, the P ions for forming the channel regions 13, 23 can be implanted in the respective regions by the same ion implantation process as is the case with the embodiments 1 through 3, and this enables integration of the depletion MOS transistor 301 and the masked ROM transistor 302 on a single or common semiconductor substrate 1, while minimizing the steps of manufacturing the depletion MOS transistor 301. Further, the depletion MOS transistor 301, the masked ROM transistor 302, and the submicron CMOS device (303, 304) can be integrated on a single or common semiconductor substrate 1.

Figure 15:
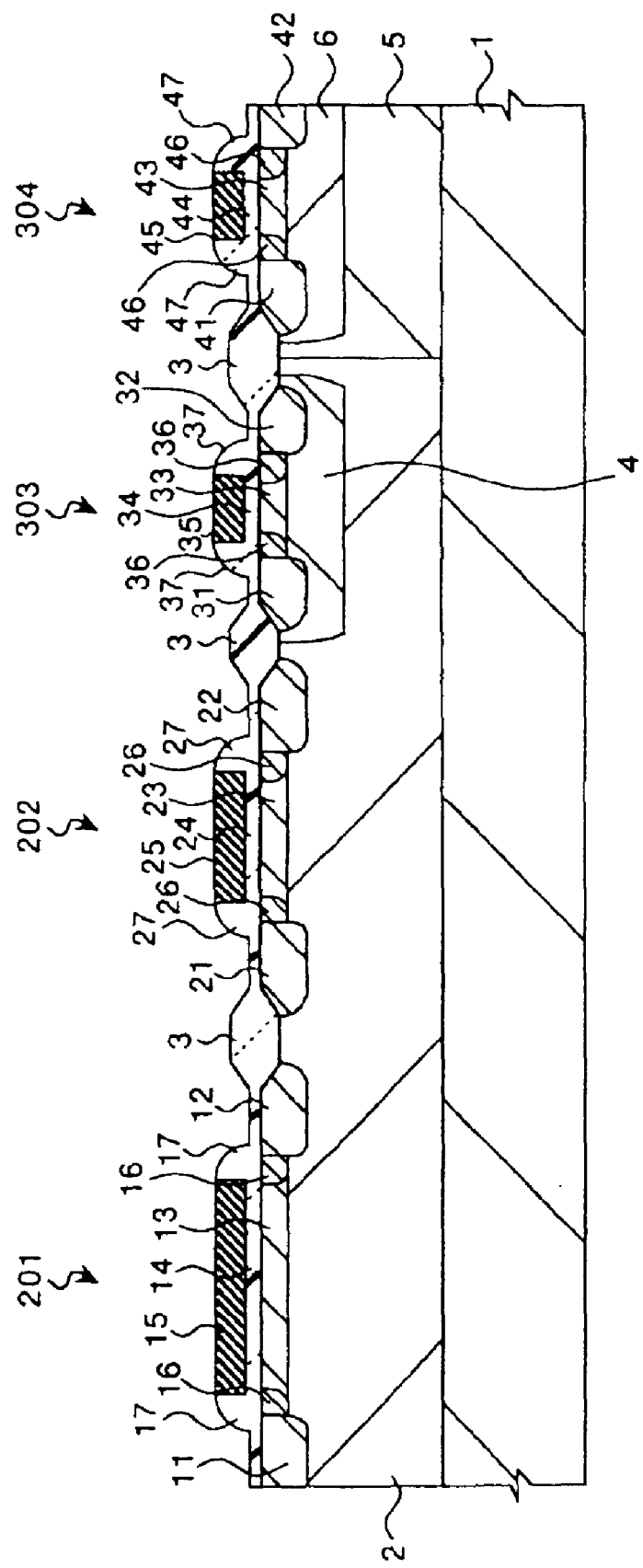
FIG. 15 is a longitudinal sectional view showing a principal part of a semiconductor integrated circuit device according to a fifth embodiment of the present invention.

FIG. 15 is a longitudinal sectional view showing a principal part of the semiconductor integrated circuit device according to a fifth embodiment of the present invention. With the arrangement of the second embodiment 2 shown in FIG. 5, the semiconductor integrated circuit device according to the fifth embodiment is constructed such that the NMOS transistor 303 and the PMOS transistor 304 as well as the depletion MOS transistor 201 and the masked ROM transistor 202 are integrated on a single or common semiconductor substrate 1.

More specifically, the fifth embodiment is different from the fourth embodiment in that the P⁻ punch through stopper region 4 is not provided in the depletion MOS transistor or the masked ROM transistor. Otherwise, the arrangement of the fifth embodiment is identical with that of the second or fourth embodiment. Therefore, parts and elements of the fifth embodiment corresponding to those of the second or fourth embodiment are denoted by the same reference numerals, and a description thereof is omitted herein.

If the P⁻ punch-through stopper region 4 is not provided in the depletion MOS transistor 201 as is the case with the fifth embodiment, the P⁻ punch-through stopper region 4 must not be provided in the masked ROM transistor 202. This is because the optimum value of the impurity concentration of the channel regions 13, 23 shifts to a value representing a lower concentration if the P⁻ punch-through stopper region 4 is not provided in the depletion MOS transistor 202. If the masked ROM transistor 202 has the P⁻ punch-through stopper region 4, the resistance of the ROM is significantly increased to lower the response speed.

Figure 16:
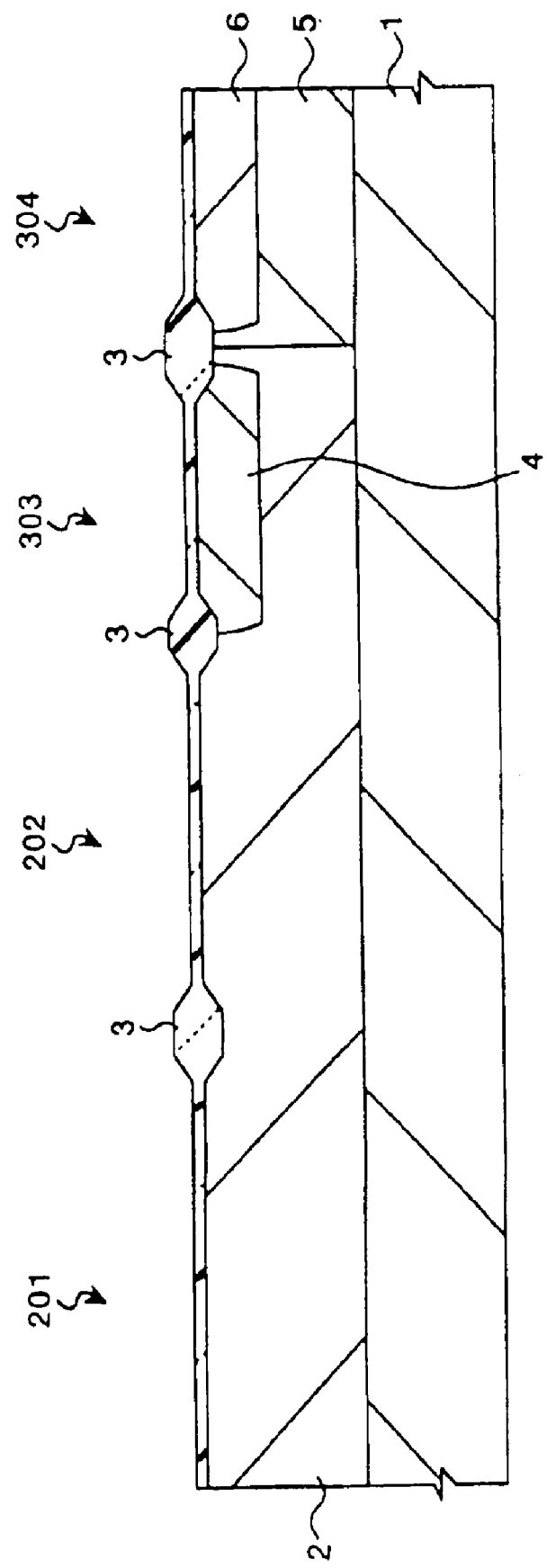
FIG. 16 is a longitudinal sectional view showing the principal part of the semiconductor integrated circuit device during manufacturing of the fifth embodiment of the present invention.
Figure 17:
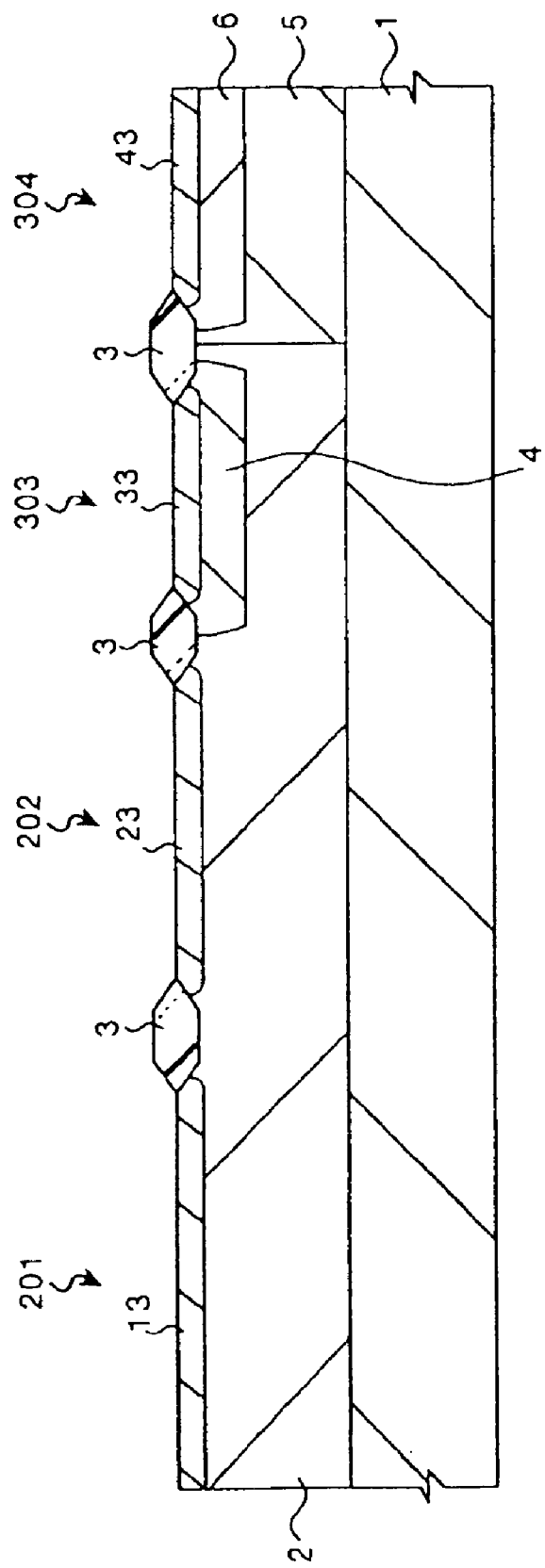
FIG. 17 is a longitudinal sectional view showing the principal part of the semiconductor integrated circuit device during manufacturing of the fifth embodiment of the present invention.
Figure 18:
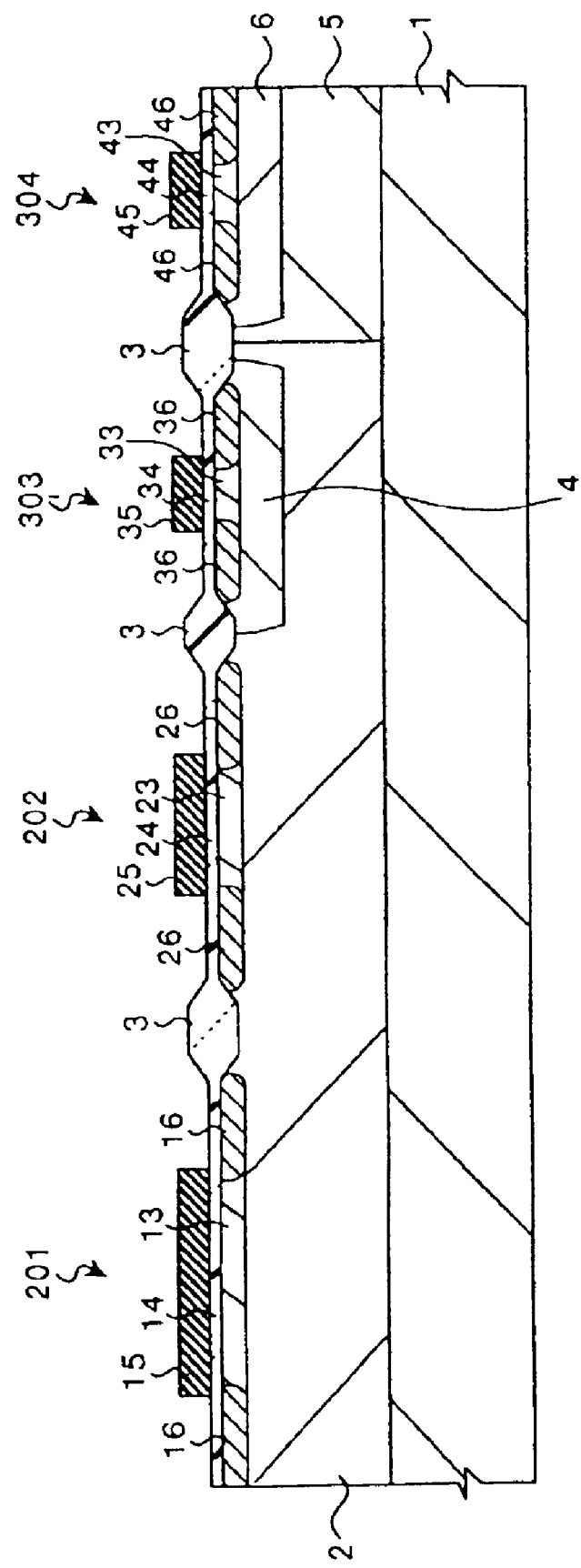
FIG. 18 is a longitudinal sectional view showing the principal part of the semiconductor integrated circuit device during manufacturing of the fifth embodiment of the present invention.

A description will now be given of a process for manufacturing the semiconductor integrated circuit device according to the fifth embodiment. FIGS. 16–18 are longitudinal sectional views showing the principal part of the semiconductor integrated circuit device during manufacturing of the fifth embodiment. First, as shown in FIG. 16, the N type well region 5 and the P type well region 2 are sequentially formed at the principal side of the semiconductor substrate 1. Thereafter, a mask shields a region where the masked ROM transistor 202 is formed and a region where the PMOS transistor 304 is formed, and in a region where the NMOS transistor 303 is formed. The P⁻ punch-through stopper region 4 is formed by a known method.

Further, a mask shields a region where the depletion MOS transistor 201 is formed, a region where the masked ROM transistor 202 is formed, and a region where the NMOS transistor 303 is formed, and in a region where the PMOS transistor 304 is formed, the N⁻ punch-through stopper region 6 is formed by a known method. The field oxide film 3 is then formed.

The channel regions 33, 43 are then formed by implantation of BF₂ ions as shown in FIG. 17, and the channel regions 13, 23 are formed by implantation of P ions with a mask shielding the NMOS transistor 303, the PMOS transistor 304, and part of the transistors constituting the masked ROM. A surface oxide film is then removed.

Then, as shown in FIG. 18, the gate insulating films 14, 24, 34, 44 and the gate electrodes 15, 25, 35, 45, the N⁻ LDD regions 16, 26, 36, and the P⁻ LDD region 46 are sequentially formed. The spacer films 17, 27, 37, 47, the N⁺ source regions 11, 21, 31 and the N⁺ drain regions 12, 22, 32, the P⁺ source region 41 and the P⁺ drain region 42 are then sequentially formed. This is illustrated in FIG. 15. It should be noted that each impurity-diffusing region is activated by a thermal treatment. Although not illustrated, an interlayer insulating film can be laminated on the entire surface of the substrate, and contact holes are formed in the surface of the substrate. A source electrode, a drain electrode, wiring, a passivation film, and the like are then formed to complete the semiconductor integrated circuit device.

According to the above-described fifth embodiment, the P ions for forming the channel regions 13, 23 can be implanted in the respective regions by the same ion implantation process as is the case with the embodiments 1 through 4, and this enables integration of the depletion MOS transistor 201 and the masked ROM transistor 202 on the same semiconductor substrate 1, while minimizing the steps of manufacturing the depletion MOS transistor 201. Further, the depletion MOS transistor 201, the masked ROM transistor 202, and the submicron CMOS device (303, 304) can be integrated on a single or common semiconductor substrate.

Further, according to the fifth embodiment, since the P⁻ punch-through stopper region 4 is not provided in the depletion MOS transistor 201, the number of diffusion layers, which determines a threshold voltage of the depletion MOS transistor 201, is smaller than the number of diffusion layers in the embodiment 4 by one. This inhibits the variation of the threshold voltage, and in the case where the depletion MOS transistor 201 is used for the reference voltage generating circuit, the output voltage can vary within a smaller range.

Figure 19:
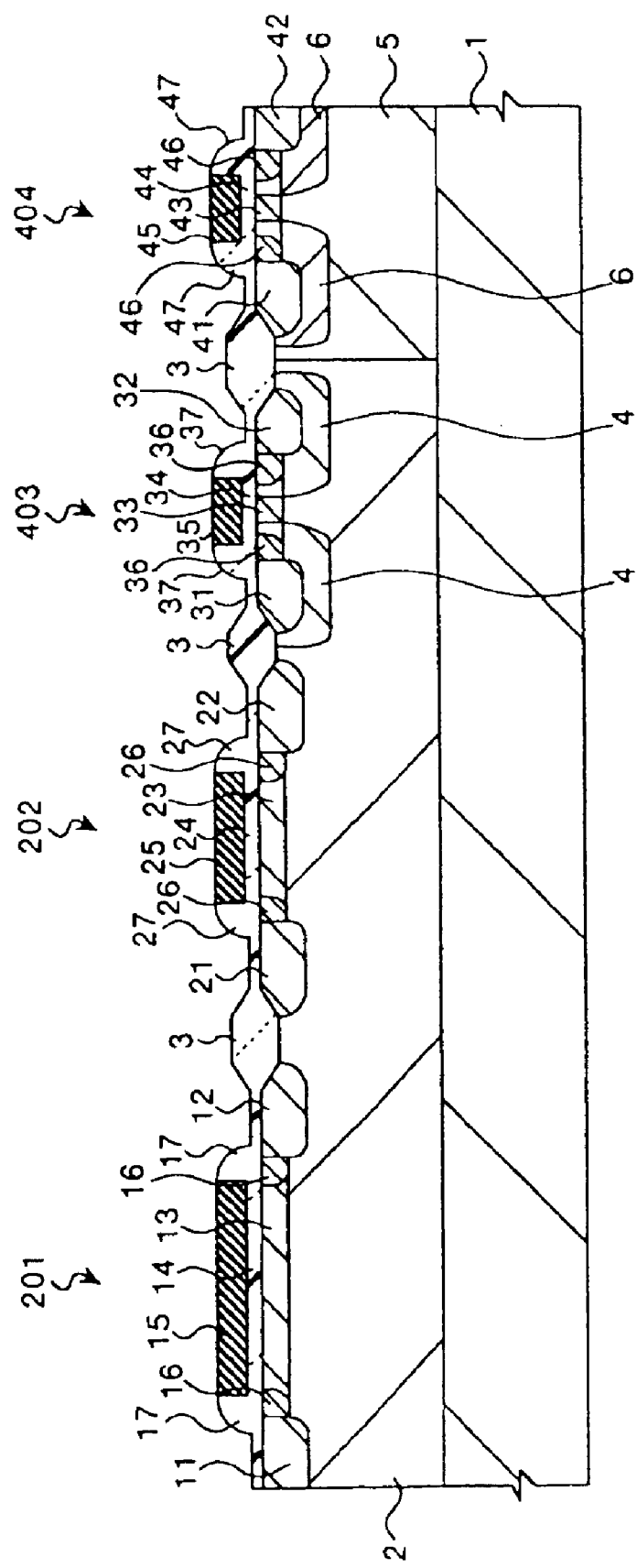
FIG. 19 is a longitudinal sectional view showing the principal part of a semiconductor integrated circuit device according to a sixth embodiment of the present invention.

FIG. 19 is a longitudinal sectional view showing a principal part of the semiconductor integrated circuit device according to a sixth embodiment of the present invention. With the arrangement of the second embodiment shown in FIG. 5, the semiconductor integrated circuit device according to the sixth embodiment is constructed such that an NMOS transistor 403 and a PMOS transistor 404, as well as the depletion MOS transistor 201 and the masked ROM transistor 202, are integrated on a single or common semiconductor substrate 1.

More specifically, the sixth embodiment is different from the fifth embodiment in that both the P⁻ punch-through stopper region 4 and the N⁻ punch-through stopper region 6 are constructed in the form of a pocket. Otherwise, the arrangement of the sixth embodiment is identical with the fifth embodiment. Therefore, parts and elements of the sixth embodiment corresponding to those of the fifth embodiment are denoted by the same reference numerals, and a description thereof is omitted herein.

Figure 20:
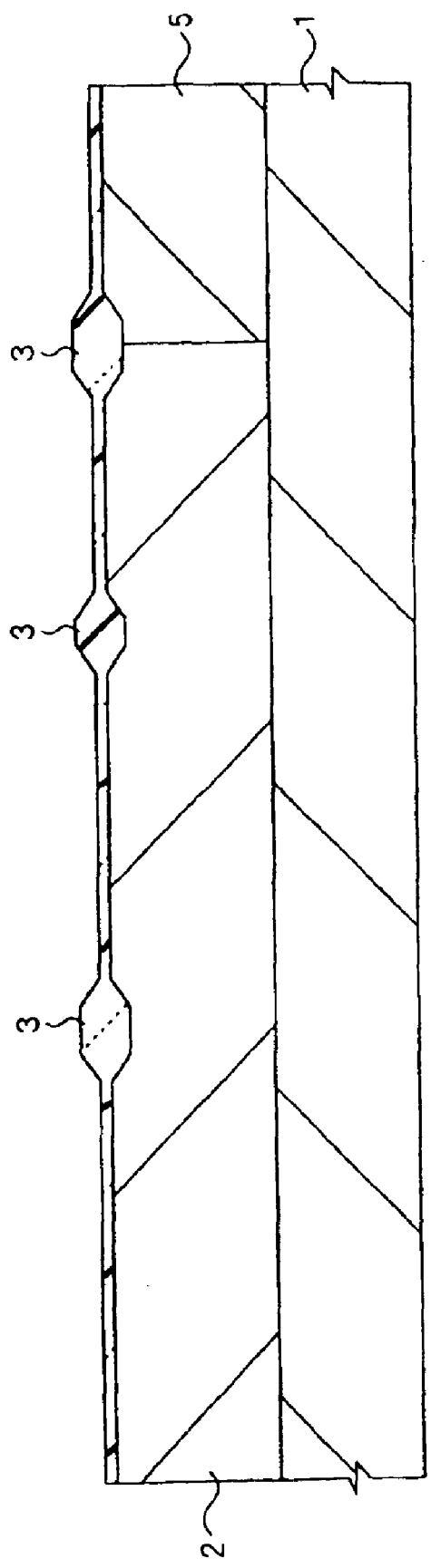
FIG. 20 is a longitudinal sectional view showing the principal part of the semiconductor integrated circuit device during manufacturing of the sixth embodiment of the present invention.
Figure 21:
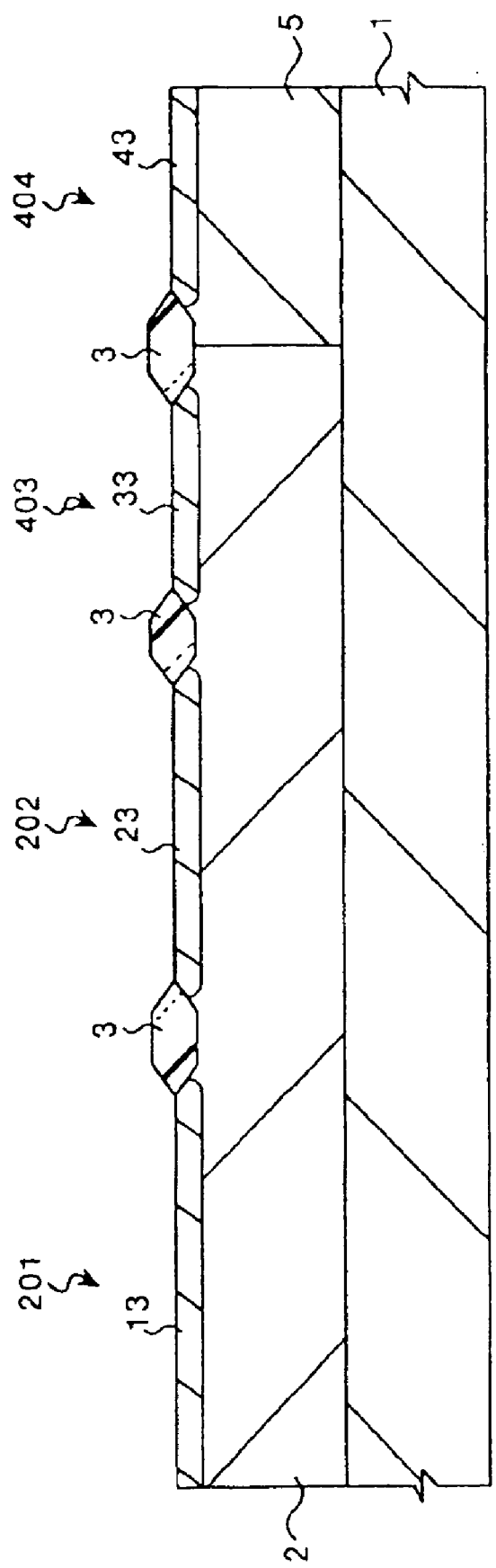
FIG. 21 is a longitudinal sectional view showing the principal part of the semiconductor integrated circuit device during manufacturing of the sixth embodiment of the present invention.
Figure 22:
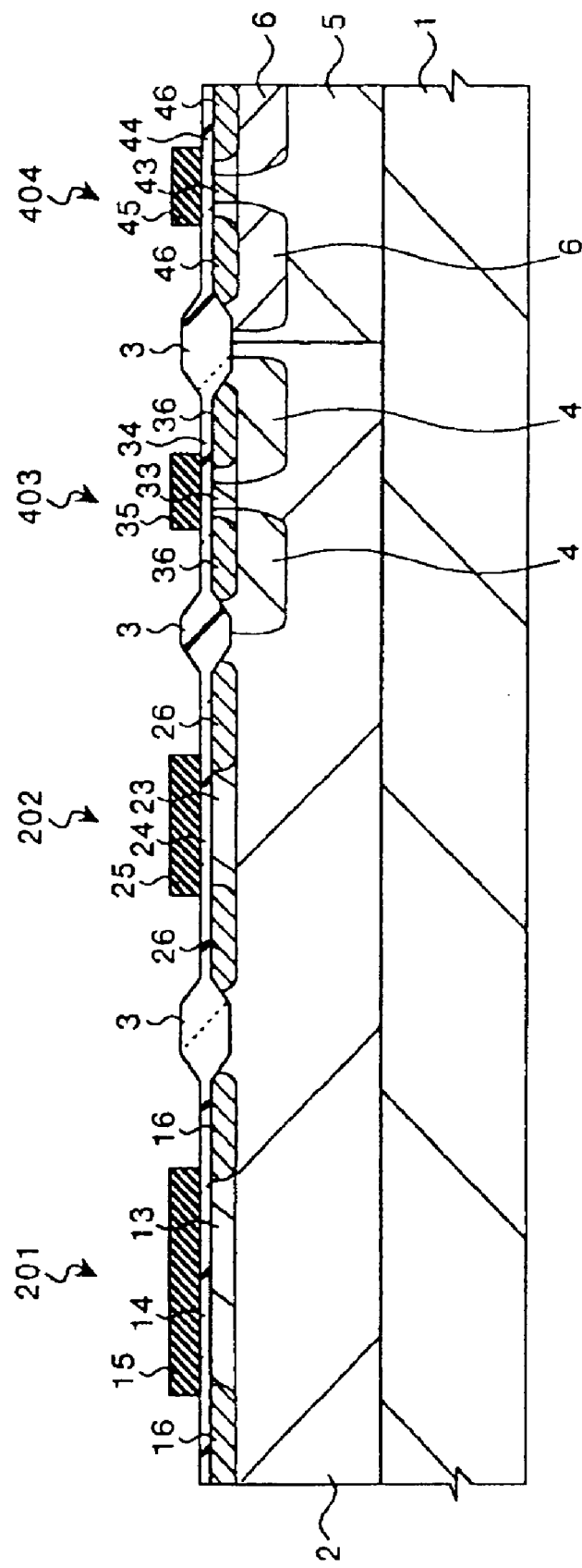
FIG. 22 is a longitudinal sectional view showing the principal part of the semiconductor integrated circuit device during manufacturing of the sixth embodiment of the present invention.

A description will now be given of a process for manufacturing the semiconductor integrated circuit device according to the sixth embodiment. FIGS. 20–22 are longitudinal sectional views showing the principal part of the semiconductor integrated circuit device during manufacturing of the sixth embodiment. First, as shown in FIG. 20, the N type well region 5 and the P type well region 2 are sequentially formed at the principal side of the semiconductor substrate 1. The field oxide film 3 is then formed.

The channel regions 33, 43 are then formed by implantation of BF₂ ions as shown in FIG. 21, and the channel regions 13, 23 are formed by implantation of P ions with a mask shielding the NMOS transistor 403, the PMOS transistor 404, and part of the transistors forming the masked ROM. A surface oxide film is then removed.

Then, as shown in FIG. 22, the gate insulating films 14, 24, 34, 44 and the gate electrodes 15, 25, 35, 45 are sequentially formed. The spacer films 17, 27, 37, 47, the N⁺ source regions 11, 21, 31 and the N⁺ drain regions 12, 22, 32, the P⁺ source region 41 and the P⁺ drain region 42 are then sequentially formed. Thereafter, a mask shields a region where the depletion MOS transistor 201 is formed, a region where the masked ROM transistor 202 is formed and a region where the PMOS transistor 404 is formed, and in a region where the NMOS transistor 403 is formed, the P⁻ punch-through stopper region 4 is formed by an ion implantation method based on self-aligning using the gate electrode 35 as a mask.

Further, a mask shields a region where the depletion MOS transistor 201 is formed, a region where the masked ROM transistor 202 is formed, and a region where the NMOS transistor 403 is formed, and in a region where the PMOS transistor 404 is formed, the N⁻ punch-through stopper region 6 is formed by a known ion implantation method based on self-aligning using the gate electrode 45 as a mask. Thereafter, the N⁻ LDD regions 16, 26, 36, and the P⁻ LDD region 46 are sequentially formed. This is illustrated in FIG. 22.

The spacer films 17, 27, 37, 47, the N⁺ source regions 11, 21, 31 and the N⁺ drain regions 12, 22, 32, the P⁺ source region 41 and the P⁺ drain region 42 are sequentially formed. This is illustrated in FIG. 19. It should be noted that each impurity-diffusing region is activated by a thermal treatment. Although not illustrated, an interlayer insulating film can be laminated on the entire surface of the substrate, and contact holes are formed in the surface of the substrate. A source electrode, a drain electrode, wiring, a passivation film, and the like are then formed to complete the semiconductor integrated circuit device.

According to the above-described sixth embodiment, the P ions for forming the channel regions 13, 23 can be implanted in the respective regions by the same ion implantation process as is the case with the first through fifth embodiments, and this enables integration of the depletion MOS transistor 201 and the masked ROM transistor 202 on a single or common semiconductor substrate 1, while minimizing the steps of manufacturing the depletion MOS transistor 201. Further, the depletion MOS transistor 201, the masked ROM transistor 202, and the submicron CMOS device (403, 404) can be integrated on a single or common semiconductor substrate 1.

Further, according to the sixth embodiment, since the P⁻ punch-through stopper region 4 is not provided in the depletion MOS transistor 201, the number of diffusion layers, which determines a threshold voltage of the depletion MOS transistor 201, is smaller than the number of diffusion layers in the fourth embodiment by one. This inhibits the variation of the threshold voltage, and in the case where the depletion MOS transistor 201 is used for the reference voltage generating circuit, the output voltage can vary within a smaller range.

Figure 23:
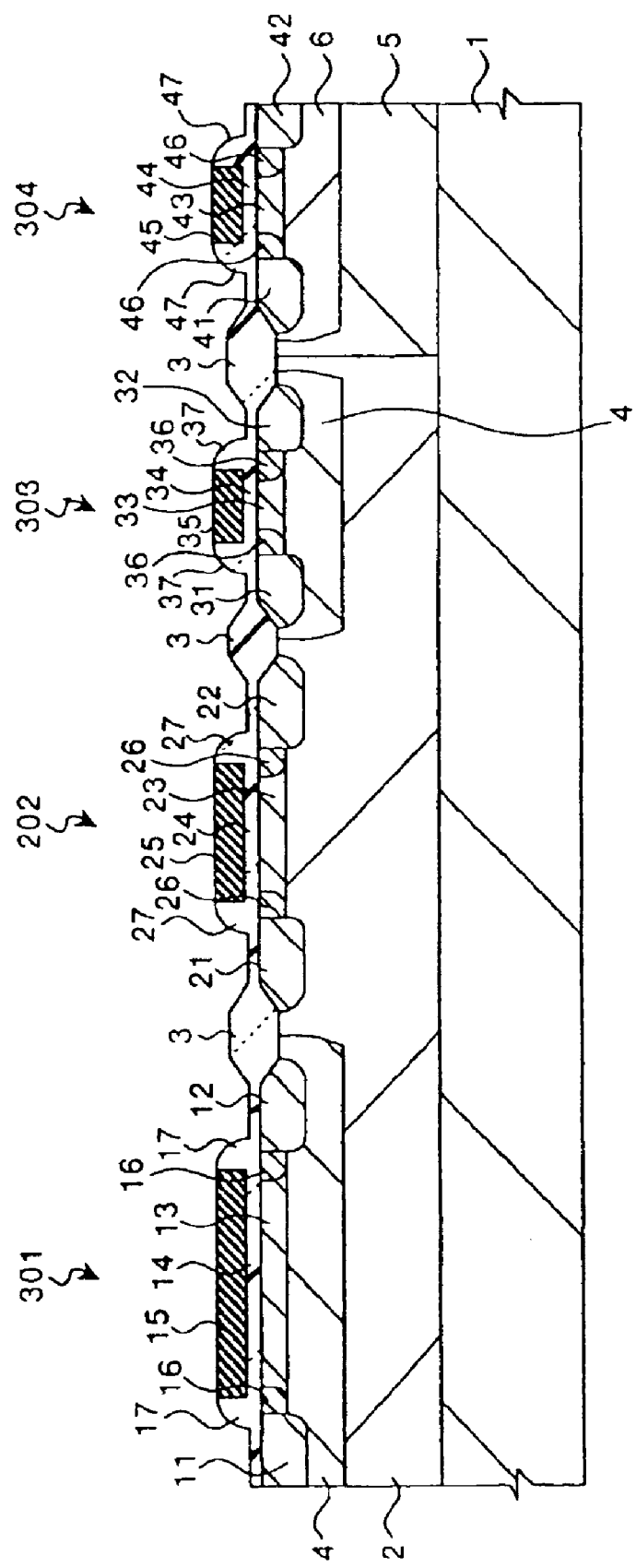
FIG. 23 is a longitudinal sectional view showing the principal part of a semiconductor integrated circuit device according to a seventh embodiment of the present invention.

FIG. 23 is a longitudinal sectional view showing a principal part of the semiconductor integrated circuit device according to a seventh embodiment of the present invention. With the arrangement of the third embodiment shown in FIG. 7, the semiconductor integrated circuit device according to the seventh embodiment is constructed such that the masked ROM transistor 202 according to the second embodiment in FIG. 5 and the NMOS transistor 303 and the PMOS transistor 304 forming the submicron CMOS device can be integrated on a single or common semiconductor substrate 1.

More specifically, the seventh embodiment is different from the fourth embodiment in that the P⁻ punch-through stopper region 4 is not provided in the masked ROM transistor. In other words, the seventh embodiment is different from the fifth or sixth embodiment in that the P⁻ punch-through stopper region 4 is provided in the depletion MOS transistor. It should be noted that parts and elements of the seventh embodiment corresponding to those of the other embodiments are denoted by the same reference numerals, and a description thereof is omitted herein.

Figure 24:
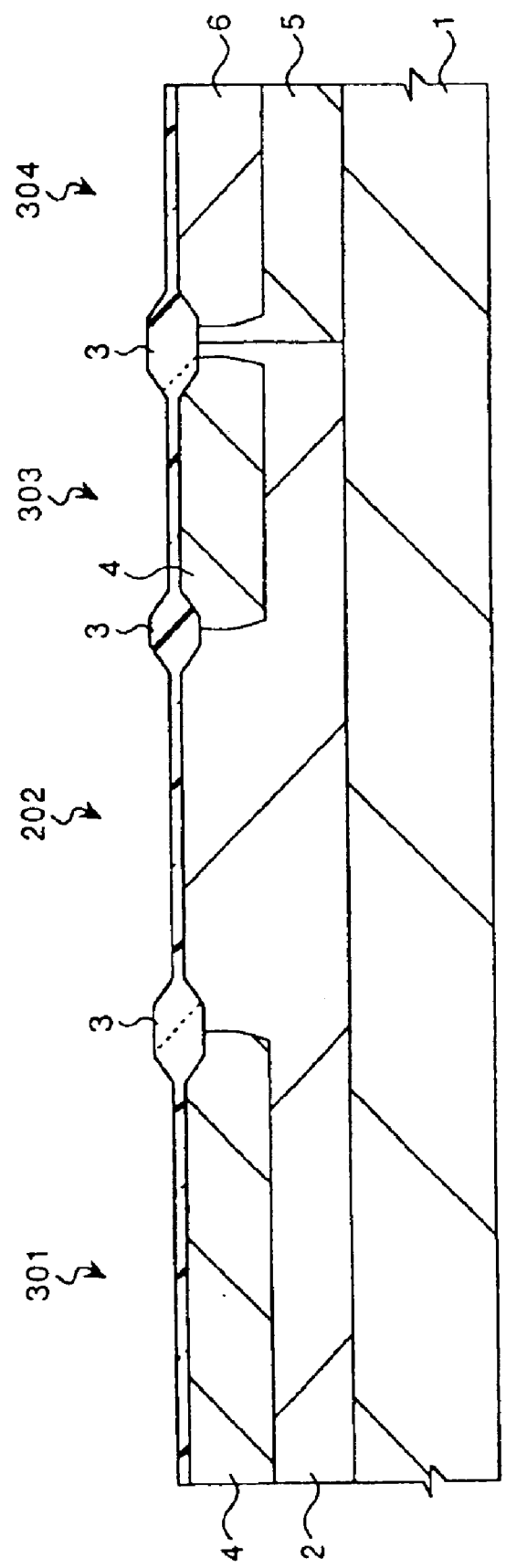
FIG. 24 is a longitudinal sectional view showing the principal part of the semiconductor integrated circuit device during manufacturing of the seventh embodiment of the present invention.
Figure 25:
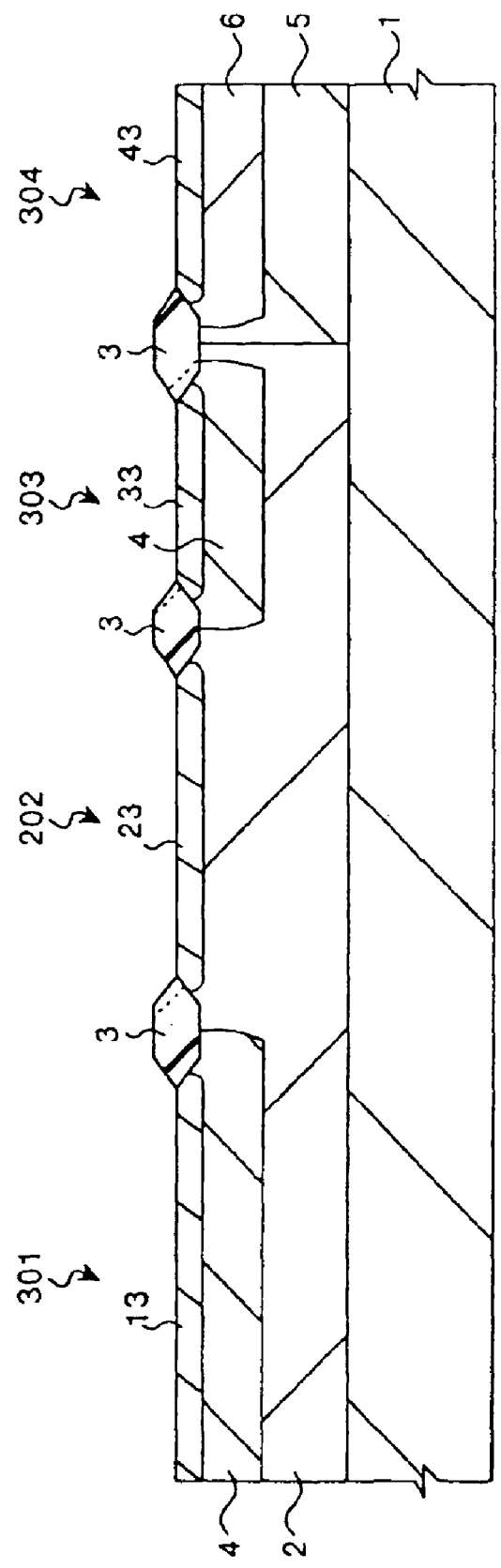
FIG. 25 is a longitudinal sectional view showing the principal part of the semiconductor integrated circuit device during manufacturing of the seventh embodiment of the present invention.
Figure 26:
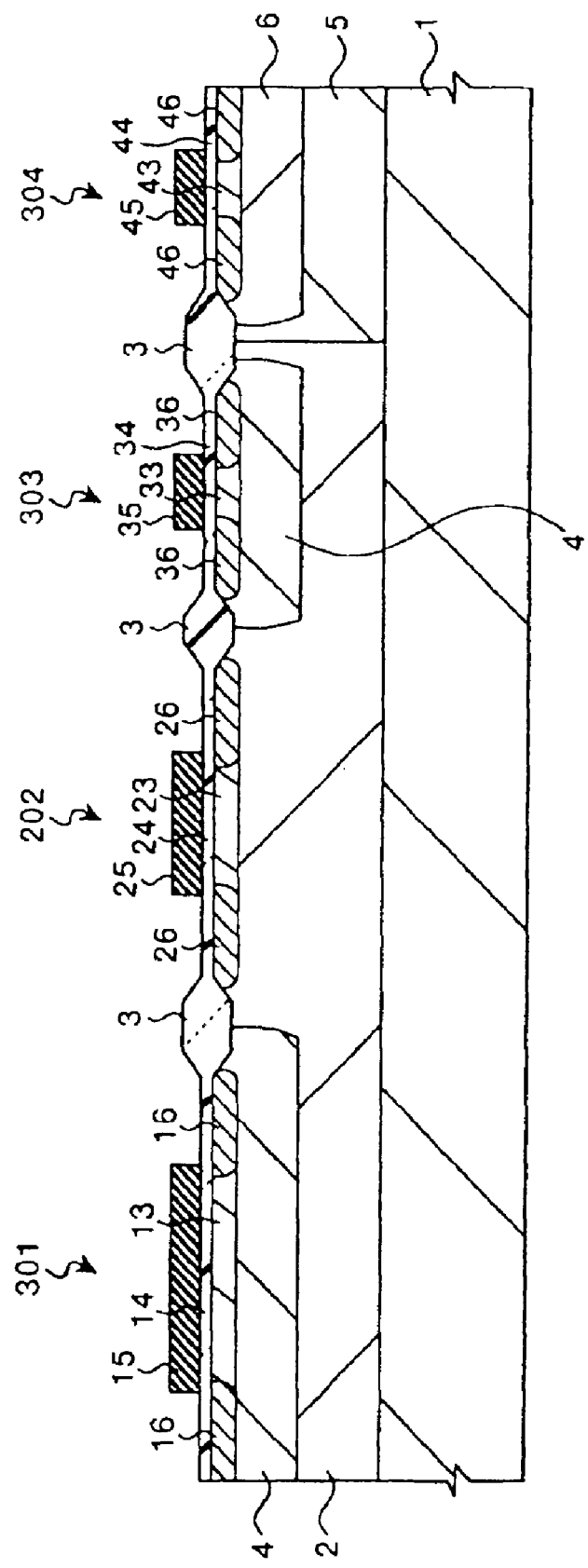
FIG. 26 is a longitudinal sectional view showing the principal part of the semiconductor integrated circuit device during manufacturing of the seventh embodiment of the present invention.

A description will now be given of a process for manufacturing the semiconductor integrated circuit device according to the seventh embodiment. FIGS. 24–26 are longitudinal sectional views showing the principal part of the semiconductor integrated circuit device in a manufacturing step according to the seventh embodiment. First, as shown in FIG. 24, the N type well region 5 and the P type well region 2 are sequentially formed at the principal side of the semiconductor substrate 1. The field oxide film 3 is then formed. Thereafter, a mask shields a region where the masked ROM transistor 202 is formed and a region where the PMOS transistor 304 is formed, and in a region where the depletion MOS transistor 301 is formed and a region where the NMOS transistor 303 is formed, the P$^-$ punch-through stopper region 4 is formed by a known method.

Further, a mask shields a region where the depletion MOS transistor 301 is formed, a region where the masked ROM transistor 302 is formed, and a region where the NMOS transistor 304 is formed, and in a region where the PMOS transistor 304 is formed, the N$^-$ punch-through stopper region 6 is formed by a known method. The field oxide film 3 is then formed.

The P$^-$ channel regions 33, 43 are then formed by implantation of BF$_2$ ions as shown in FIG. 25, and a mask shields the NMOS transistor 303, the PMOS transistor 304, and part of the transistors constituting the masked ROM to form the channel regions 13, 23 by implantation of P ions. A surface oxide film is then removed.

Then, as shown in FIG. 26, the gate insulating films 14, 24, 34, 44 and the gate electrodes 15, 25, 35, 45, the N$^-$ LDD regions 16, 26, 36, and the P$^-$ LDD region 46 are sequentially formed. Thereafter, the spacer films 17, 27, 37, 47, the N$^+$ source regions 11, 21, 31 and the N$^+$ drain regions 12, 22, 32, the P$^+$ source region 41 and the P$^+$ drain region 42 are sequentially formed. This is illustrated in FIG. 23. It should be noted that each impurity-diffusing region is activated by a thermal treatment. Although not illustrated, an interlayer insulating film can be laminated on the entire surface of the substrate, and contact holes are formed in the surface of the substrate. A source electrode, a drain electrode, wiring, a passivation film, and the like are then formed to complete the semiconductor integrated circuit device.

According to the above-described seventh embodiment, the P ions for forming the channel regions 13, 23 can be implanted in the respective regions by the same ion implantation process as is the case with the first through sixth embodiments, and this enables integration of the depletion MOS transistor 301 and the masked ROM transistor 302 on a single or common semiconductor substrate 1, while minimizing the steps of manufacturing the depletion MOS transistor 301. Further, the depletion MOS transistor 301, the masked ROM transistor 302, and the submicron CMOS device (303, 304) can be integrated on a single or common semiconductor substrate 1.

Further, according to the seventh embodiment, the resistance of the ROM is lowered to improve the response speed since the impurity concentration of the channel regions 13, 23 is increased in accordance with the impurity concentration of the P punch-through stopper region 4, although the threshold voltage of the depletion MOS transistor 301 may vary to a larger degree than in the fifth or sixth embodiment since the P$^-$ punch-through stopper region 4 is provided in the depletion MOS transistor 301.

Figure 27:
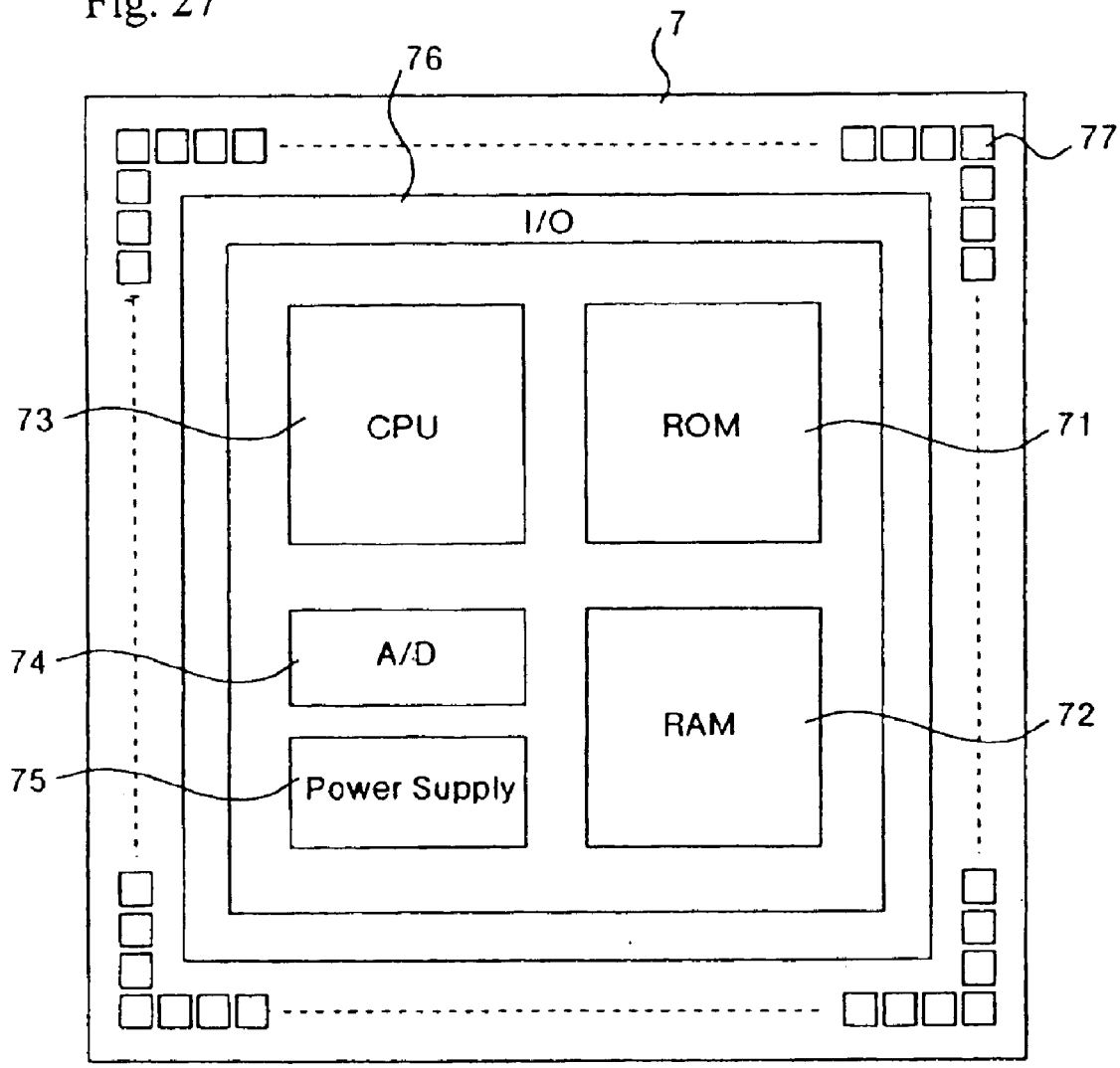
FIG. 27 is a schematic diagram showing an example of an IC chip that can be applied the semiconductor integrated circuit device according to the present invention.

FIG. 27 is a schematic diagram showing an example of an IC chip to which the semiconductor integrated circuit device according to the present invention can be applied. This IC chip is a single-chip microcomputer in which a ROM 72, a RAM 72, a CPU 73, an analog-digital converting circuit (A/D) 74, a reference voltage generating circuit (Power Supply) 75, etc., are integrated on a semiconductor substrate 7, and at the periphery thereof, an input/output circuit region (I/O) 76, a bonding pad 77, and the like are disposed. In the above-described embodiments, the depletion MOS transistors 101, 201, 301 are used for the reference voltage generating circuit 75, the masked ROM transistors 102, 202, 302 constitute the ROM 71, and the NMOS transistors 303, 403 and the PMOS transistors 304, 404 are used for the CPU 73 or the like. The operating speed of the CPU 73 and the like is preferably about 1 to several MHz.

According to the present invention, the implantation of impurity ions for changing the enhancement type transistor into the depletion type transistor and the implantation of impurity ions for changing the transistor forming the masked ROM into resistance are carried out by the same ion implantation process. This enables integration of the depletion MIS transistor, the transistor forming the masked ROM, and the submicron CMOS on the same semiconductor substrate, without increasing the number of steps for processing the depletion type transistor.

Advantageously, the semiconductor integrated circuit device according to the above-described embodiments enables a digital circuit having at least a masked ROM and a reference voltage generating circuit comprised of a depletion type MOS transistor to be formed on a single IC chip.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP PA 2001-052099, in their entirety, including the drawings, claims, and the specification thereof, is incorporated herein by reference.

What is claimed is:

1. A method of manufacturing a semiconductor integrated circuit device, comprising:

forming a first transistor of a MIS depletion type and a second transistor forming a masked ROM on a single semiconductor substrate by:

forming a well region of a first-conductivity-type in a first region where the first transistor is to be formed and a second region where the second transistor is to be formed;

implanting impurity ions of a first-conductivity-type in the regions where the first and second transistors are to be formed to form a first and second channel regions;

implanting impurity ions of a second-conductivity-type in the first and second channel regions of the first transistor and some of the second transistors to permit current to flow when a gate-source voltage of the first transistor is zero and to change some of the second transistors into resistance, said implanting of impurity ion of said second conductivity type in both of said channel regions being carried out in the same ion implantation step; and thereafter forming first and second gate insulating films, first and second gate electrodes, and first and second source and drain regions of a second-conductivity-type in each of the first and second transistors.

2. A method of manufacturing a semiconductor integrated circuit device, as claimed in claim 1, further comprising:
selectively forming a field oxide on the well region, wherein the field oxide separates the regions in which the first and second transistors are formed.

3. A method of manufacturing a semiconductor integrated circuit device, as claimed in claim 1, additionally comprising forming a first LDD region of a second-conductivity-type having a lower impurity concentration than the first source region or the first drain region, formed between the first channel region and the first source region and between the first channel region and the first drain region.

4. A method of manufacturing a semiconductor integrated circuit device, as claimed in claim 3, additionally comprising forming a second LDD region of a second-conductivity-type having a lower impurity concentration than the second source region or the second drain region, formed between the second channel region and the second source region and between the second channel region and the second drain region.

5. A method of manufacturing a semiconductor integrated circuit device, as claimed in claim 1, additionally comprising forming a punch-through stopper region of a first-conductivity-type formed between the first source region and the first drain region and between the second source region and the second drain region.

6. A method of manufacturing a semiconductor integrated circuit device, as claimed in claim 1, additionally comprising forming an enhancement type NMOS transistor and an enhancement type PMOS transistor on said single semiconductor substrate.

7. A method of manufacturing a semiconductor integrated circuit device, as claimed in claim 6, wherein said NMOS transistor is formed in a P-type well region, and includes a third source region of an N-type and a third drain region an N-type formed in the P-type well region, and a third channel region interposed between the third source and drain regions, a third LDD region of an N-type having a lower impurity concentration than the third source region or the third drain region formed between the third channel region and the third source region and between the third channel region and the third drain region, a third gate electrode formed on the third channel region over the gate insulating film, and a P-type punch-through stopper region formed between the third source region and the third drain region.

8. A method of manufacturing a semiconductor integrated circuit device, as claimed in claim 6, wherein said PMOS transistor is formed in an N-type well region, and comprises a fourth source region of a P-type and a fourth drain region of a P-type formed in the N-type well region, a fourth channel region interposed between the fourth source and drain regions, and a fourth LDD region of a P-type having a lower impurity concentration than the fourth source region or the fourth drain region formed between the fourth channel region and the fourth source region and between the fourth channel region and the fourth drain region, a fourth gate electrode formed on the fourth channel region over the gate insulating film, and an N-type punch-through stopper region formed between the fourth source region and the fourth drain region.

9. A method of manufacturing a semiconductor integrated circuit device, as claimed in claim 1, further comprising forming a first-conductivity-type punch-through stopper region provided between the first source region and the first drain region.

10. A method of manufacturing a semiconductor integrated circuit device, as claimed in claim 1, further comprising forming a first conductivity-type punch-through stopper region between the second source region and the second drain region.

* * * * *